United States Patent [19]
Takebe et al.

[11] Patent Number: 5,279,162
[45] Date of Patent: Jan. 18, 1994

[54] SEMICONDUCTOR SENSOR

[75] Inventors: Katsuhiko Takebe; Mizuho Doi, both of Tokyo; Hiroyasu Takehara, Wako; Satoshi Hiyama, Tokyo; Masanobu Urabe, Wako, all of Japan

[73] Assignee: Honda Giken Kogyo Kabushiki Kaisha, Tokyo, Japan

[21] Appl. No.: 848,693

[22] Filed: Mar. 9, 1992

Related U.S. Application Data

[62] Division of Ser. No. 403,296, Sep. 5, 1989, Pat. No. 5,115,292.

[30] Foreign Application Priority Data

| Sep. 2, 1988 | [JP] | Japan | 63-219862 |
| Sep. 8, 1988 | [JP] | Japan | 63-224975 |
| Jan. 10, 1989 | [JP] | Japan | 1-3496 |
| Jan. 24, 1989 | [JP] | Japan | 1-14581 |
| May 31, 1989 | [JP] | Japan | 1-137883 |
| May 31, 1989 | [JP] | Japan | 1-137884 |
| Jun. 8, 1989 | [JP] | Japan | 1-145752 |

[51] Int. Cl.⁵ .................... G01L 9/00; H01L 29/84
[52] U.S. Cl. ................................... 73/726; 73/518; 73/720; 73/DIG. 4; 374/143; 257/26
[58] Field of Search .......... 73/777, 754, 723, 724, 73/727, DIG. 4, 119A, 717, 720, 726, 708, 518; 257/15, 26, 27, 35, 55, 415; 374/143

[56] References Cited

U.S. PATENT DOCUMENTS

| 4,633,099 | 12/1986 | Tanabe et al. | 73/777 |
| 4,698,657 | 10/1987 | Watanabe et al. | 357/25 |
| 4,873,871 | 10/1989 | Bai et al. | 73/777 |

FOREIGN PATENT DOCUMENTS

| 62-121367 | 6/1987 | Japan . |
| 62-213280 | 9/1987 | Japan . |
| 63-18272 | 1/1988 | Japan . |

Primary Examiner—Donald O. Woodiel
Attorney, Agent, or Firm—Stevens, Davis, Miller & Mosher

[57] ABSTRACT

This invention relates to a semiconductor sensor for detecting external physical forces, such as acceleration, contact pressures, air pressures, mechanical vibrations, etc. The semiconductor sensor according to this invention is characterized by the use of compound semiconductors of high piezoelectricity, such as GaAs, etc. Conventionally sensors of the cantilever type, diaphragm type, etc. are made of silicon. These prior art sensors have low detection sensitivity, and their characteristics tend to deteriorate. The sensor according to this invention is made of GaAs, which has high piezoelectricity and can retain good characteristics of the semiconductor even at high temperatures and includes a field-effect transistor formed on the GaAs for sensing a stress. The FET is driven by a constant current or a constant voltage so as to detect a change of an electrical characteristic (e.g., threshold characteristic) due to a stress. The structure of the sensor according to this invention enables the sizes of the sensors not only to be diminished but also to reduce the fabrication costs. When a stress is applied to the FET, the transconductance changes, and the temperature changes, consequently the I-V characteristic changes. An a.c. signal biased by a direct current is supplied to the gate of the FET, and a drain current is detected in an a.c. component and a d.c. component so as to detect a temperature concurrently with a detection of a stress.

24 Claims, 33 Drawing Sheets

SEMICONDUCTOR SENSOR

This is a division of application Ser. No. 07/403,296 filed Sep. 5, 1989, now U.S. Pat. No. 5,115,292.

DETAILED DESCRIPTION OF THE INVENTION

1. Background of the Invention

This invention relates to a semiconductor sensor, specifically to a sensor which detects external physical forces, such as acceleration, contact pressures, air pressures, mechanical vibrations, etc.

2. Related Background Art

The prior art in the field of this art are HOSHINO's Japanese Patent Laid-Open Publication No. 121367/1987, IKUDOME's Japanese Patent Laid-Open Publication No. 18272/1988, MIHARA's Japanese Patent Laid-Open Publication No. 213280/1985, etc.

In Hoshino's sensor, oxided silicon. ($SiO_2$) is formed in a cantilever on a silicon substrate, and at the proximal end of the cantilever is disposed a stress sensing device comprising a piezoelectric resistor device, whereby acceleration is electrically detected. The piezoelectric resistor device for sensing this stress is made of Si, for example, provides a sensitivity of about $100 \times 10^{-12}$ $cm^2$/dyne. But a disadvantage of this sensor is insufficient sensitivity of detecting acceleration.

In IKUDOME's sensor, a transistor is built in a semiconductor sensor, and an electric charge piezoelectrically generated is supplied to the gate of the transistor, whereby acceleration is detected based on a change of an electrical characteristic. In this sensor, a piezoelectric body and an inertial mass body are disposed on the gate oxide film of a MOSFET. But in IKUDOME's sensor, the piezoelectric body and the inertial mass body have to be formed on the FET, which adversely makes the sensor large-sized and raises its fabrication cost.

In MIHARA's sensor, a silicon substrate is formed in cantilevers, and at the proximal end of one of the cantilevers, a semiconductor resistor as a piezoelectric resistor device is formed by the diffusion, whereby acceleration is electrically detected. One of the cantilevers is for acceleration detection, the other being for temperature compensation so as to improve the temperature characteristic. But, in MIHARA's sensor, the piezoelectric effect of the silicon substrate is used to convert a change of a stress into a change of a resistivity. Resultantly high detection sensitivity cannot be obtained. The dynamic range necessary for a sensor is not wide enough. The temperature compensation has not reached the sufficient level. Furthermore, another cantilever is formed for the temperature compensation. A temperature difference tends to occur between the cantilevers for the acceleration detection and that for the temperature compensation, and when such difference occurs, the temperature compensation becomes very insufficient.

On the other hand, Japanese Patent Laid-Open Publication No. 17830/1982, and Japanese Patent Laid-Open Publication No. 148377/1982 describe sensors of different types. The sensor of the former includes a MIS transistor provided on a diaphragm. The fact that the switching characteristic of the MIS transistor changes depending on a pressure is used so as to change a frequency of the oscillation circuit. The sensor of the latter includes a Schottky junction providing a pressure sensitivity, and a transistor which detects an output of the junction, whereby a pressure, etc. can be detected. But a problem with these prior art sensors is that it is difficult to detect stresses with high sensitivity.

A first object of this invention is to provide a semiconductor sensor having a high detection sensitivity and a wide dynamic range.

A second object of this invention is to provide a semiconductor sensor which can be fabricated at low costs and can be miniaturized.

A third object of this invention is to provide a semiconductor sensor in which a stress detection device and a signal processing circuit can be integrated on a single chip.

A fourth object of this invention is to provide a semiconductor sensor which is able to operate normally when a surrounding temperature rises.

A fifth object of this invention is to provide a semiconductor sensor which is able not only to detect stresses but also to sense the temperature.

SUMMARY OF THE INVENTION

A first semiconductor sensor according to this invention comprises a substrate; a crystal growth layer of a piezoelectric semiconductor formed on the substrate; and a stress sensing device formed on the crystal growth layer and whose electric characteristic changes in accordance with a stress or a change of the stress; the portion of the substrate corresponding to the stress sensing device being removed in a required range. In this sensor, the crystal growth layer of a piezoelectric semiconductor is formed in a cantilever for sensing acceleration, and in a diaphragm for sensing pressures. Accordingly, when the cantilever or the diaphragm is exposed to an external physical force, such as acceleration, a pressure, or others, a stress is generated in the crystal growth layer. For the electrical detection of the stress due to the external physical force or a change of the stress, a stress sensing device, such as a field-effect transistor (FET), or others, is formed in the portion of the crystal growth layer.

A second semiconductor sensor according to this invention comprises a support; an elastically deformable member to be deformed by an external physical force and secured to the support; a field-effect transistor formed in a portion of the region of a piezoelectric semiconductor in which a deformation of the elastically deformable member takes place, a stress due to the external physical force or a change of the stress being sensed based on a change of an electric characteristic of the field-effect transistor. In this sensor, when the FET formed in the piezoelectric semiconductor is exposed to a deformation, a stress due to the deformation is generated in the interface between the gate electrode and the channel layer, and polarization takes place. Resultantly electrical characteristics, e.g., threshold, of the FET change. Based on changes of the electrical characteristics, acceleration, pressures, etc. can be detected.

A third semiconductor sensor according to this invention comprises a support; an elastically deformable member to be deformed by an external physical force and secured to the support; a field-effect transistor formed in a portion of the region of a piezoelectric semiconductor in which a deformation of the elastically deformable member takes place, the gate thereof being supplied with a set d.c. bias; a constant-current supply means for supplying a set drain current to the drain of the field-effect transistor; and signal detecting means for outputting a detected signal corresponding to a stress due to the external physical force or a change of the stress, based on a change of the drain potential of the field-effect transistor. In this sensor, the gate of the FET is biased with a required voltage, and the drain thereof is supplied with a constant-current. This enables the detection output to be increased.

A fourth semiconductor sensor according to this invention comprises a support; an elastically deformable member to be deformed by an external physical force and secured to the support; a field-effect transistor formed in a portion of the region of a piezoelectric semiconductor in which a deformation of the elastically deformable member takes place; bias supply means for supplying a d.c. bias to the gate of the field-effect transistor and a constant-voltage between the source and the drain of the field-effect transistor; and signal detecting means for outputting a detected signal corresponding to a stress due to the external physical force or a change of the stress, based on a change of the drain current of the field-effect transistor. In this sensor, since a constant d.c. voltage is supplied to the gate, source and drain of the FET, the detection output can be increased even when shortening the gate length of the FET causes the short channel effect.

A fifth semiconductor sensor according to this invention comprises a support; an elastically deformable member to be deformed by an external physical force and secured to the support; a field-effect transistor formed in a portion of the region of a piezoelectric semiconductor in which a deformation of the elastically deformable member takes place, signal supply means for supplying an a.c. voltage signal to the gate of the field-effect transistor; and signal detecting means for outputting a detected signal corresponding to a stress due to the deformation or a change of the stress, based on a change of an a.c. current component of an output signal of the field-effect transistor. In this sensor, since the transconductance of the FET changes due to a stress, the amplitude of an a.c. component of a source-drain current changes in accordance with a stress. Based on this fact, a stress can be detected based on a change of the a.c. output of the FET.

A sixth semiconductor sensor according to this invention comprises a support; an elastically deformable member to be deformed by an external physical force and secured to the support; a field-effect transistor formed in a portion of the region of a piezoelectric semiconductor in which a deformation of the elastically deformable member takes place; signal supply means for supplying an a.c. voltage signal biased with a set direct current to the gate of the field-effect transistor; first signal detecting means for outputting a first detected signal corresponding to a stress due to the deformation or a change of the stress, based on a change of an a.c. component of an output signal of the field-effect transistor; and second signal detecting means for outputting a second detected signal corresponding to a change of a temperature of the elastically deformable member, based on a change of a d.c. component of the output of the field-effect transistor. In this sensor, a stress can be detected based on a change of the a.c. output of the FET as in the fifth semiconductor sensor. Since the characteristics of the FET change in accordance with temperatures, a temperature change can be detected based on a change of the d.c. component of a source-drain current.

A seventh semiconductor sensor according to this invention comprises a support; an elastically deformable member to be deformed by an external physical force and secured to the support; a plurality of field-effect transistors formed in portions of the regions of a piezoelectric semiconductor and oriented in different directions to one another with respect to a direction of generation of a stress due to the deformation; and signal detecting means for outputting a detected signal corresponding to the stress or a change of the stress, based on a difference of changes in an electrical characteristic among the field-effect transistors. In this sensor, two FETs are formed in different directions in portions of the piezoelectric semiconductor region in which deformations of the elastically deformable members, e.g., a cantilever for sensing acceleration and a diaphragm for sensing a pressure, take place. One of the FETs the length of whose gate intersects the direction of generation of a stress at a larger intersection angle has the electrical characteristics which largely change by a stress due to a deformation. The other of the FETs which has a smaller intersection angle has the electrical characteristics which do not greatly change. This enables an external physical force to be detected with high precision. It is not necessary to form the two FETs at different positions, which makes it possible to make a temperature difference between the FETs minimum so as to improve the temperature characteristic.

An eighth semiconductor sensor according to this invention comprises a support; an elastically deformable member to be deformed by an external physical force and secured to the support; a plurality of field-effect transistors whose gates have physical strengths different from one another; and signal detecting means for outputting a detected signal corresponding to a stress due to the external physical force or a change of the stress, based on a difference of changes in an electrical characteristic among the field-effect transistors. In this sensor, in a portion of the piezoelectric semiconductor region in which a deformation of the elastically deformable member takes place, there are formed two FETs the physical strengths of whose gate electrodes are made different by making the gate electrodes of different materials and changing their thicknesses, etc. One of the FETs having the gate electrode of higher physical strength has the electrical characteristics greatly changed depending on a stress level. The other of the FETs having lower physical strength has the electrical characteristics which do not greatly change depending on a stress level.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
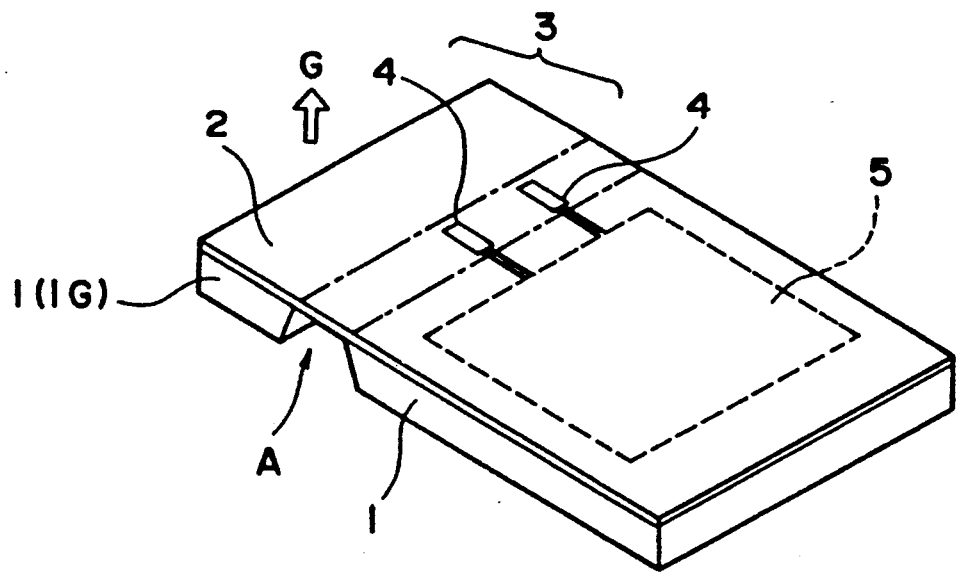
FIGS. 1(a)-(e) are perspective views of basic structures of semiconductor sensors according to embodiments of this invention.
Figure 1:
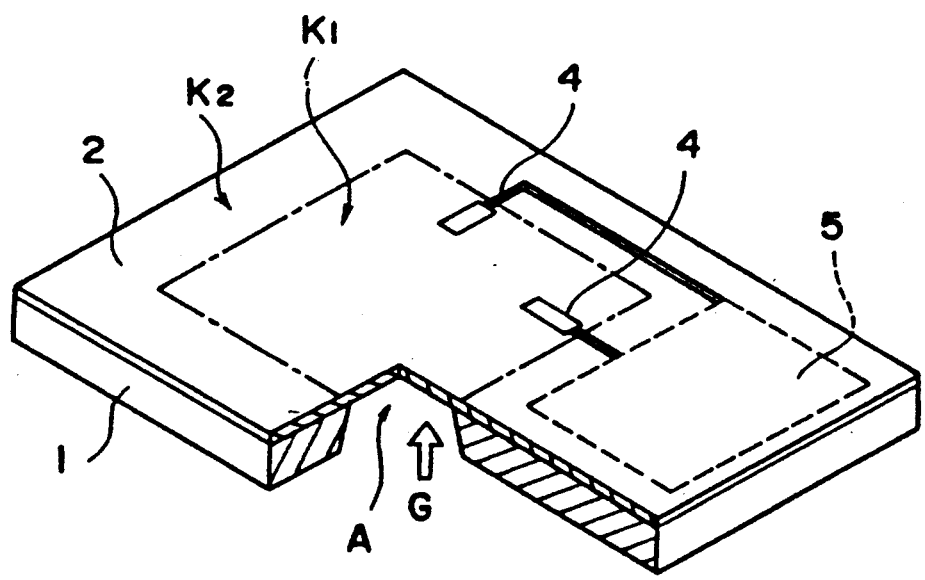
Figure 1:
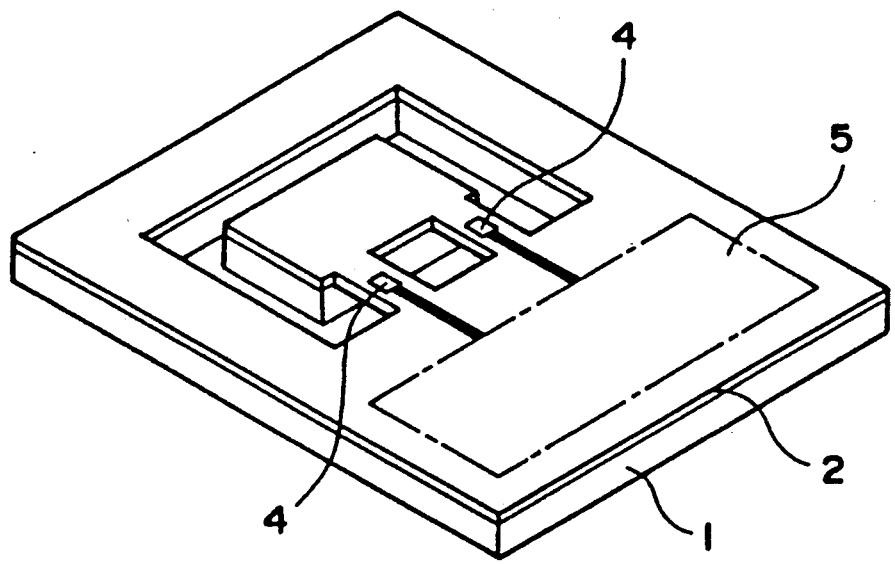
Figure 1:
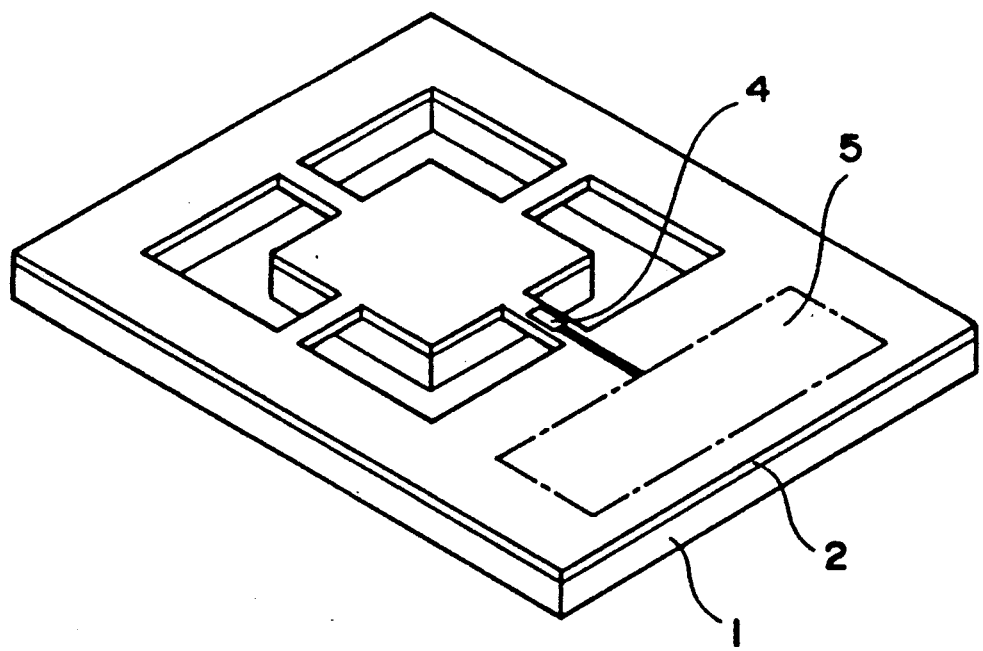
Figure 1:
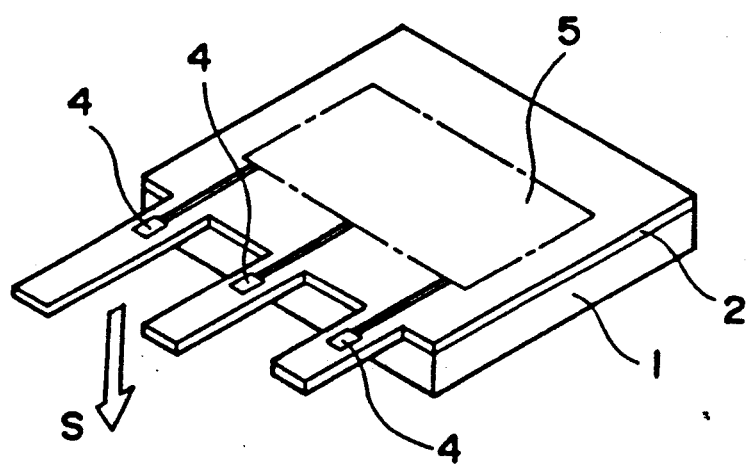

FIG. 1(a) shows a cantilever-type semiconductor sensor which detects acceleration as an example of external physical forces. FIG. 1(b) shows a diaphragm-type semiconductor sensor which detects a pressure. In the sensor of FIG. 1(a), a crystal growth layer 2 of gallium arsenide (GaAs), which is a highly piezoelectric compound semiconductor, is epitaxially grown on a substrate of a single atom of silicon (Si). A portion of the substrate 1 (indicated by A in FIG. 1(a)) is etched off to form the left portion (as viewed in FIG. 1(a)) in a cantilever 3. In a portion of the crystal growth layer 2 at the proximal end of the cantilever 3 there are formed by an ion implantation semiconductor resistors which provide a stress sensing device 4. In a portion of the crystal growth layer 2 on the side of a support of the cantilever (right as viewed in FIG. 1(a)) there is formed a signal processing circuit 5 which processes a detected signal and supplies a drive signal to the stress sensing device 4.

In the sensor of FIG. 1(a), when acceleration is applied in the direction of the arrow G in FIG. 1(a), the substrate 1 on the side of the cantilever 3 functions as a weight 1G to cause the portion of the crystal growth layer 2 indicated by A to bend. Then a stress due to the bend changes a resistivity of the stress sensing device 4 (the piezoresistance effect). Thus, the acceleration can be electrically detected. In order to sense a stress based on a change of the resistivity of the stress sensing device 4, it is necessary to form a bridge circuit of 4, for example, resistor elements and to amplify the detected signal. But these circuit members are incorporated in the signal processing circuit 5.

In the sensor of FIG. 1(b), a crystal layer 2 is formed on a substrate 1 as in the sensor of FIG. 1(a). But the portion (A) of the substrate 1 to be etched off is different from that of the sensor of FIG. 1(a). That is, in the sensor according to the embodiment of FIG. 1(b), the portion of the substrate 1 at the central portion of the sensor (a first portion $K_1$) is etched off. A second portion $K_2$ of the substrate 1 surrounding the first portion $K_1$ is left to form a support of the crystal growth layer 2. The stress sensing device 4 is formed in a semiconductor resistor formed by implanting ions in a portion of the crystal growth layer 2 where ϵ stress takes place due to a pressure. In the portion of the crystal growth layer 2 where the substrate 1 is left there is formed a signal processing circuit 5.

Figure 4:
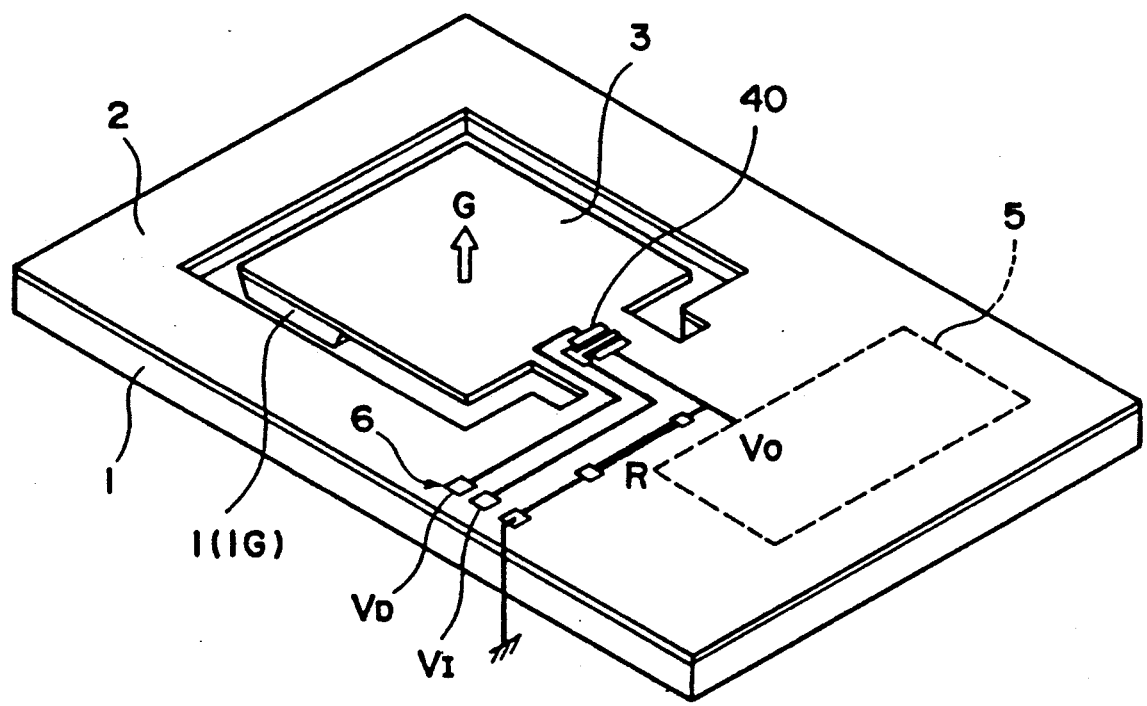
FIGS. 4(a) and (b) are perspective views of an acceleration sensor according to one embodiment of this invention.
Figure 4:
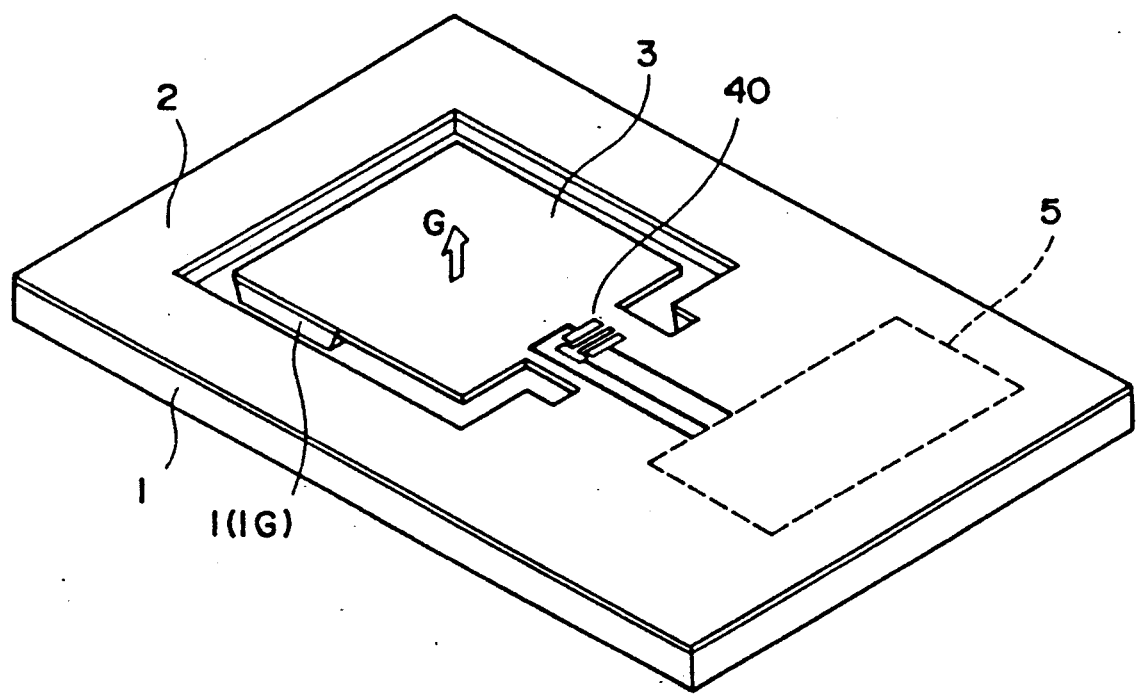

In the sensor of FIG. 1(b), when a pressure is applied in the direction of the arrow G, for example, a diaphragm $K_1$ curves upward to cause a stress. Then a resistivity of the stress sensing device 4 changes by the piezoresistance effect. As in the sensor of FIG. 1(a), 4 resistor elements are formed in a bridge circuit so as to detect the pressure quantitatively.

The semiconductor sensor according to this invention is not limited to the diaphragm and the cantilever types and may be of any type, e.g., two-point support type, four-point support type, etc., as long as stresses can be generated responsive to external physical forces, such as pressures, acceleration, etc. FIG. 1(c) shows the appearance of an acceleration sensor of the two-point support type. FIG. 1(d) shows the appearance of an acceleration sensor of the four-point support type. FIG. 1(e) shows the appearance of a flow sensor for detecting flow amounts and flow rates of gases, liquids, etc. In this flow sensor, a fluid to be detected flows in the direction of the arrow S. The sensors of FIGS. 1(c)–(e) include stress sensing devices 4 such as piezoresistant devices, FETs or others, are formed in portions where deformations take place due to external physical forces. Signal processing circuits 5 are formed on the crystal growth layers 2.

In the semiconductor sensor according to this invention, the material of the substrate is not limited to silicon and may be of Germanium (Ge) or others. The crystal growth layer 2 is not essentially of GaAs but may be of gallium phosphorous(GaP), indium phosphorus (InP), gallium aluminum arsenide (GaAlAs), etc. The etchant for removing portions of the substrate is changed depending on materials of the crystal growth layer 2. It is not essential that the signal processing circuit is formed integral with the crystal growth layer and may be formed on another semiconductor chip.

Figure 2:
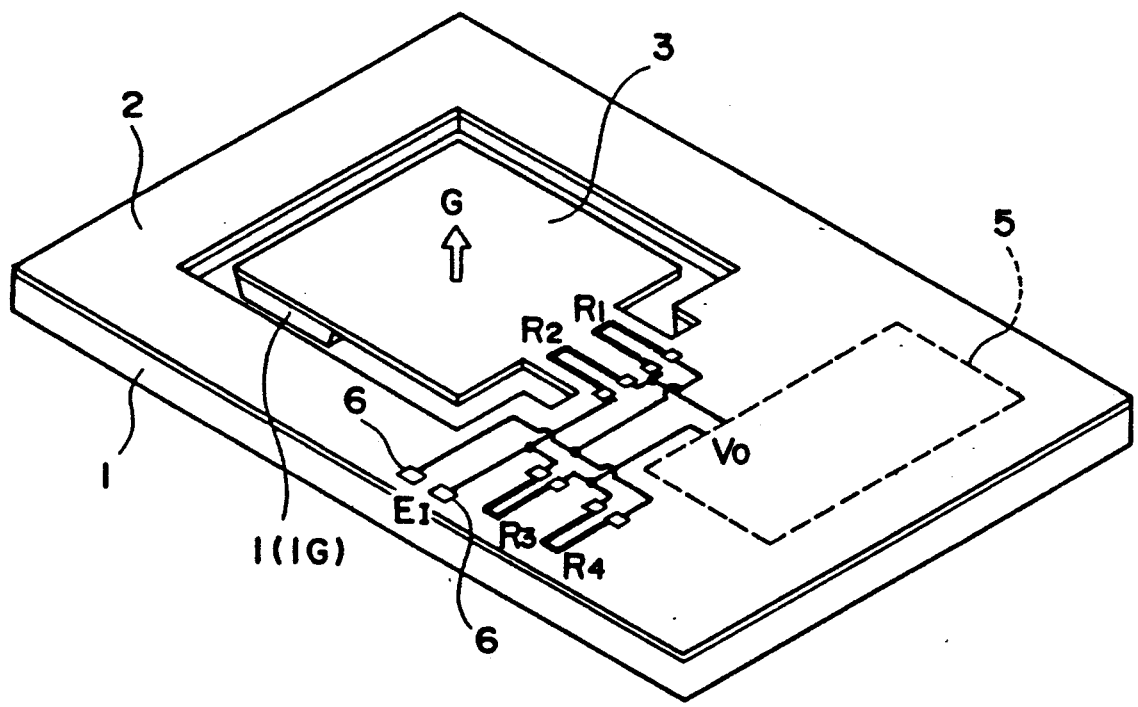
FIG. 2 is a perspective view of an acceleration sensor according to one embodiment of this invention.

With reference to FIG. 2, one embodiment of the acceleration sensor of this invention is applied to will be explained below.

As shown in FIG. 2, a GaAs crystal growth layer 2 is epitaxially grown on a Si substrate 1. The substrate 1 and the crystal growth layer 2 are removed in substantially omega shape to form a cantilever 3. The portion of the substrate at the distal end of the cantilever 3 is left to form a weight 1G. On the proximal end of the cantilever 3 there are formed semiconductor resistors $R_1$ and $R_2$. In the portion of the crystal growth layer 2 where the cantilever 3 is not formed, there are formed semiconductor resistors $R_3$, $R_4$ which are electrically wired to the resistors $R_1$, $R_2$ to constitute a half-bridge circuit.

In the sensor of FIG. 2, acceleration is applied in the direction of the arrow G, the weight 1G causes a bend at the proximal end of the cantilever 3. A stress is accordingly generated. Then the resistors $R_1$, $R_2$, which are made of GaAs doped by the ion implantation, change the resistivity by the piezoresistance effect. On the other hand, the resistors $R_3$, $R_4$ are free from the stress, and accordingly the resistivity does not change. Then a d.c. voltage $E_I$ is supplied from a pad 6 to the bridge circuit, which is constituted by the resistors $R_1$–$R_4$, so that a d.c. voltage $V_0$ is outputted corresponding to a change of the resistivity. This output voltage $V_0$ is supplied to the signal processing circuit 5 for the signal processing, e.g. amplification, etc.

Thus in this invention, since sensor structures, such as diaphragms and cantilevers, are made of a highly piezoelectric semiconductor (GaAs), the stress sensing device 4 can be formed directly in the portion of the piezoelectric semiconductor where a stress is generated. Since compound semiconductors which are piezoelectric exhibit highly the piezoelectric effect, the sensor according to this invention has high sensitivity and high detecting precision. Gallium arsenide (GaAs), which is a compound semiconductor, has such a wide band gap that the circuit in the sensor can operate at high speed sufficiently normally even in environments of high temperatures, and accordingly the sensor can have good environmental resistance. This invention can provide a sensor having good environmental resistance, high sensitivity and high precision. Furthermore, since the signal processing circuit 5 can be formed on one and the same crystal growth layer 2, the semiconductor sensor can be simplified and can be miniaturized.

The semiconductor sensor according to this invention can be fabricated by a simple process and with high precision. The fabrication process will be explained below with reference to FIG. 3.

Firstly, a Si substrate 1 having the top surface finished in a mirror surface is prepared. A GaAs crystal growth layer 2 is epitaxially grown on the surface. Then the stress sensing device 4 and the signal processing circuit 5 are formed by implanting ions in the crystal growth layer 2 (FIG. 3(a)). Then a photoresist film 10 is applied to the top surface of the substrate 1 and the underside thereof with the portions to be removed opened, and the openings are formed by the known lithography.

Figure 3A:
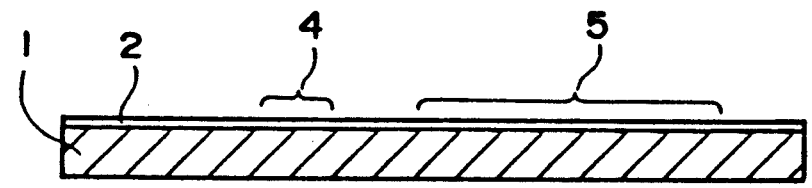
FIGS. 3(a)–(d) are sectional views of the semiconductor sensor according to this invention in its respective fabrication steps.
Figure 3B:
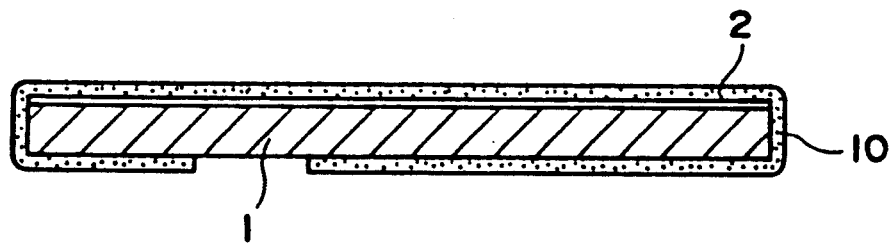
Figure 3C:
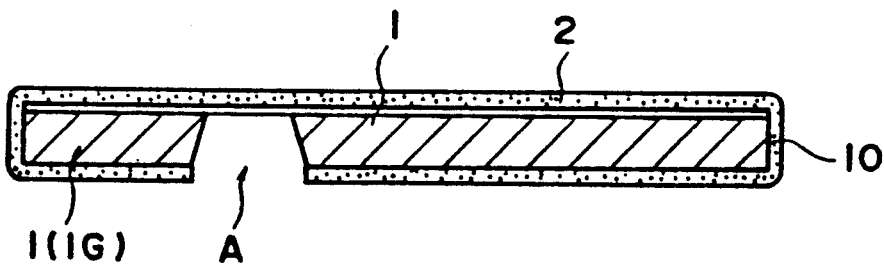
Figure 3D:
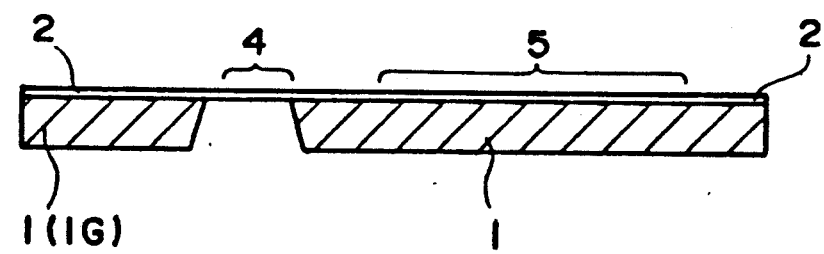

Subsequently, the substrate 1 is etched off through the openings in the photoresist film 10. For the wet etching, the etchant is HF (hydrogen fluoride) group. For the dry etching the etchant is $CF_4$ (arsenic fluoride) plasma. These etchants remove the Si readily but do not substantially etch the GaAs. Accordingly the portion of the substrate 1 indicated by the arrow A in FIG. 3 can be selectively etched off. Finally the photoresist film 10 is removed by acetone, and the cantilever structure as shown in FIG. 3(d) is completed. The bridge circuit for detecting a change of the resistivity is not limited to the above-described examples but may be the one described in Japanese Patent Laid-Open Publication No. 221164/1987.

A semiconductor sensor according to one embodiment of this invention includes a Schottky gate-type FET (MESFET) as the stress sensing device.

As shown in FIG. 4(a), a Si substrate 1 and a GaAs crystal growth layer 2 are removed in substantially omega shape to form a cantilever 3 at the center thereof. A stress sensing FET 40 provided by a MESFET is formed at the proximal end of the cantilever 3 as an elastically deformable member. A semiconductor resistor R is formed in the portion of the crystal growth layer 2 other than the cantilever 3 and is wired so as to constitute an inverter circuit together with the stress sensing FET 40. In the semiconductor sensor according to this embodiment, when acceleration is applied in the direction of the arrow G, a weight 1G causes the proximal end of the cantilever to bend. This bend generates a stress, and the so-called piezoelectric effect causes polarization in the interface between the gate electrode and the channel layer of the stress sensing FET 40, which changes electrical characteristics (e.g., the threshold) of the FET. No stress is applied to the resistor R, and the resistivity does not change. Then, when the inverter circuit constituted by the stress sensing FET 40 and the resistor R is supplied with voltages $V_D$, $V_I$ from pads 6, 6, and the earth level, a voltage $V_O$ is outputted. This output voltage $V_O$ is inputted to a signal processing circuit 5 for required signal processing. As shown in FIG. 4(b), the circuit for outputting the voltages $V_D$, $V_I$, and the resistor R may be formed in the signal processing circuit 5.

Figure 5A:
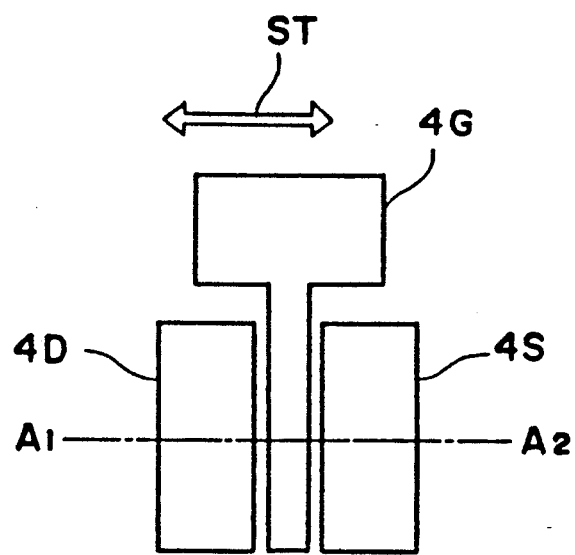
FIG. 5(a) is a plan view of MESFET used in the embodiment of this invention.
Figure 5B:
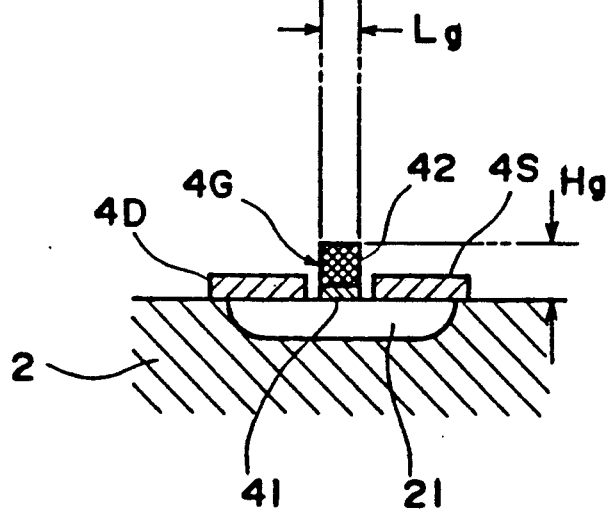
FIG. 5(b) is a section view of FIG. 5(a) along the line $A_1$–$A_2$.

The structure of the stress sensing FET used in this embodiment is shown in FIGS. 5(a) and (b). As shown in the drawings, an n-GaAs layer 21 is formed on the crystal growth layer 2 by the ion implantation. On both sides of the n-GaAs layer 2, a source electrodes 4S and a drain electrode 4D, of Au/AuGe as a ohmic metal are formed by, e.g., the lift-off. A gate electrode 4G formed between the source electrode 4S and the drain electrode 4D comprises a titanium (Ti) lower layer 41 and a tungsten (W) upper layer 42. The length of the gate is $L_g$, and the height of the gate electrode is $H_g$.

Figure 6:
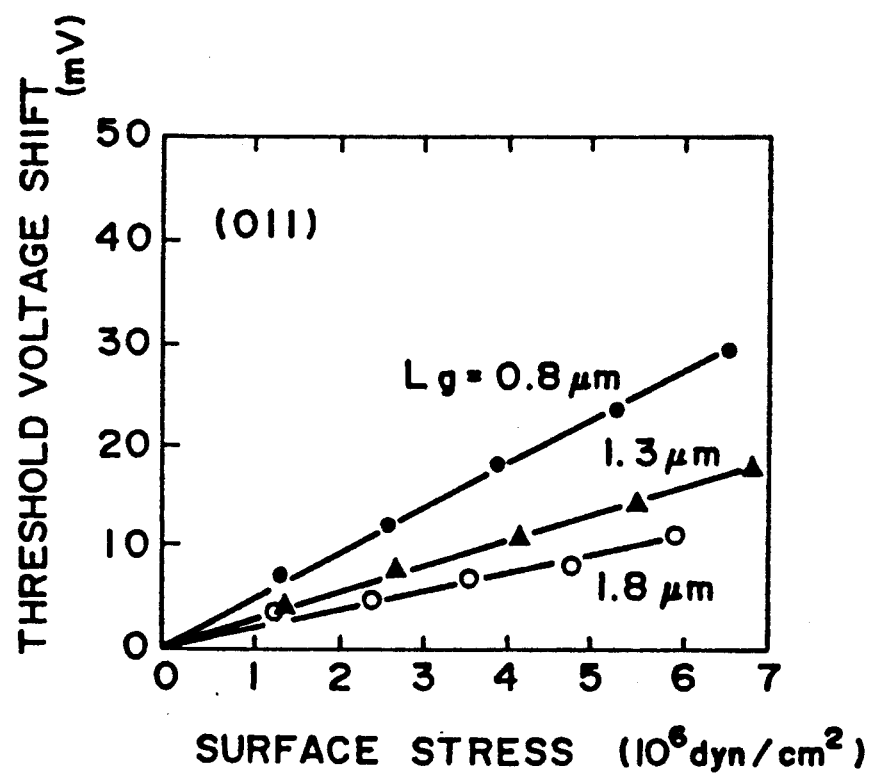
FIG. 6 is a characteristic curve of changes of the threshold of the MESFET when a stress is applied thereto.

In this MESFET, when a stress is applied in the direction of the arrow ST, a shear stress is caused in the interface between the gate electrode 4G and the channel layer of the n-GaAs layer 21, and the resultant piezoelectric effect causes polarization in the channel layer. A change of the threshold voltage due to this polarization depends on the level of a stress on the surface of the channel layer as shown in FIG. 6.

In order that the MESFET of the above-described structure effectively functions as the stress sensing FET 40, it is preferable for the FET 40 to have the following characteristics. Firstly, the shorter the gate length $L_g$ is, the higher the stress detecting sensitivity is. That is, as shown in FIG. 6, a gate length $L_g$ of about 0.8 μm yields a sensitivity twice or more that yielded by a gate length $L_g$ of about 1.8 μm. Secondly, closer contact between the gate electrode 4G and the n-GaAs layer 21 is more suitable to be used as the stress sensing FET 40. For the improvement of this contact, the lower layer 41 of the gate electrode 4G comprises Ti in a thickness of about 500 Å. Thirdly, the higher the physical strength of the gate electrode 4G is, the higher polarization takes place on the surface of the channel layer. For the increase of the physical strength of the gate electrode 4G, the upper layer 42 of the gate electrode 4G comprises, as described above, W having a high Young's modulus ($4.1 \times 10^{12}$ dyn/cm$^2$) in a thickness of about 3000 Å. It is also possible to use materials of high Young's modulus, such as TiW, TiW silicide, W silicide, etc. The height $H_g$ of the gate electrode 4G is increased so as to increase the physical strength of the gate electrode 4G and resultantly to increase a shear stress to be applied to the channel layer.

Figure 7:
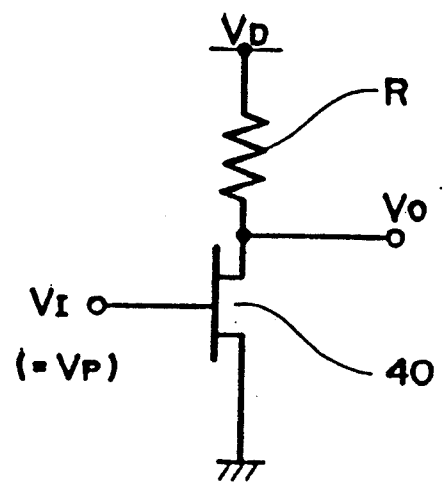
FIG. 7(a) is a diagram of a circuit for detecting changes of the threshold of the FET.
FIG. 7(b) is a view explaining the function of the circuit of FIG. 7(a)
Figure 7:
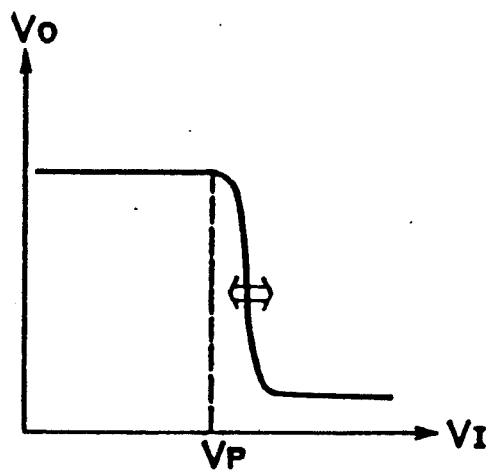

A change of the threshold voltage thus obtained can be detected by, e.g., an inverter circuit of FIG. 7(a). When a voltage $V_I$ is supplied to the gate of the MESFET as the stress sensing FET 40, the output voltage $V_O$ changes, depending on the voltage $V_I$ as shown in FIG. 7(b). When the threshold voltage of the MESFET changes, the fall point of the output voltage $V_O$ shifts as indicated by the arrow in FIG. 7(b). Here, when an input voltage to the gate is expressed by $V_I = V_P$, the presence or absence of a stress applied to the MESFET can be sensed based on a change of the output voltage $V_O$.

Figure 8:
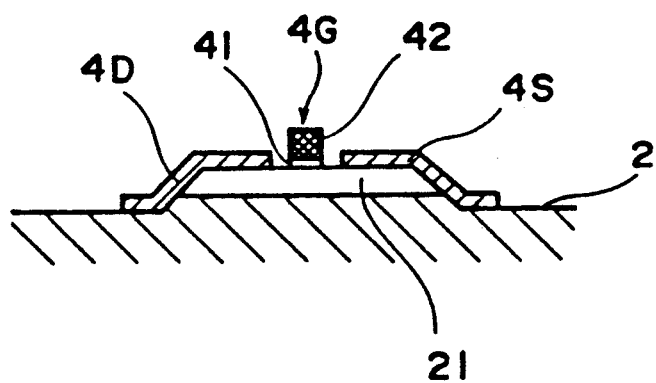
FIGS. 8(a) and (b) are sectional views of other FETs which are applicable to this invention.
Figure 8:
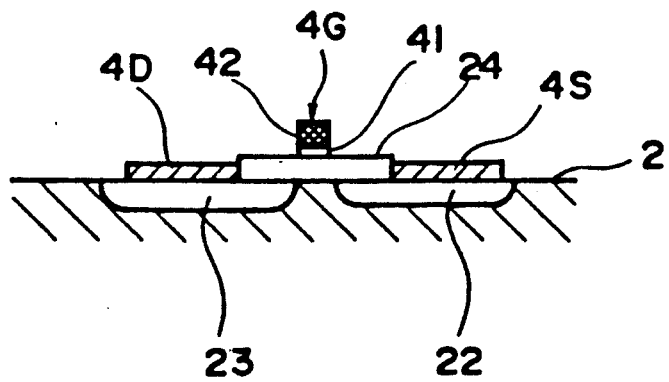

The FET used as the stress sensing FET 40 may be as shown in FIGS. 8(a) and (b). In FIG. 8(a), an n-GaAs mesa 21 is formed on a semi-insulative GaAs crystal growth layer 2. On the mesa a gate electrode 4G, a source electrode 4S and a drain electrode 4D are formed. In FIG. 8(b), n+-GaAs ohmic contact layers 22, 23 are formed on a semi-insulative GaAs crystal growth layer 2. On the contact layers 22, 23 are formed a source electrode 4S and a drain electrode 4D. Between the source and the drain electrodes 4S, 4D is formed an i-type GaAlAs layer 24. On this layer 24 is formed a gate electrode 4G. Thus the so-called MISFET is constituted.

Figure 9A:
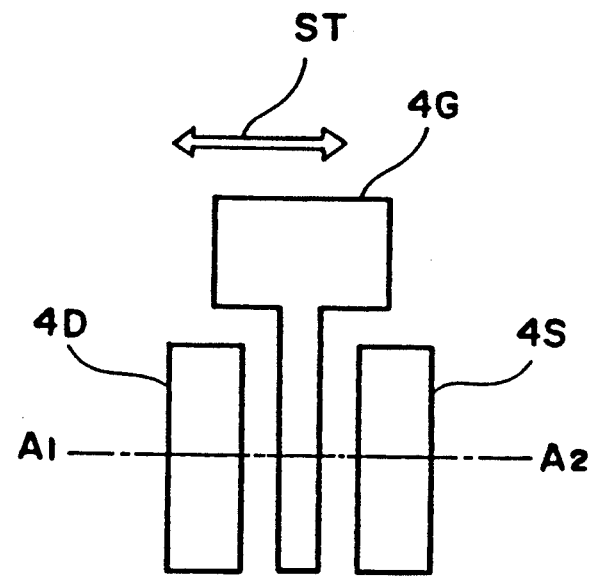
FIG. 9(a) is a plan view of a J-FET used in one embodiment of this invention.
Figure 9B:
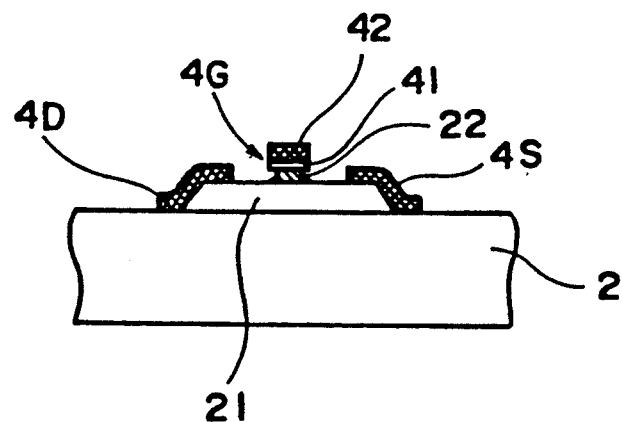
FIG. 9(b) is a section view of FIG. 9(a) along the line $A_1$–$A_2$.

The stress sensing FET 40 may be provided by the junction-type field-effect transistor (J-FET) shown in FIGS. 9(a) and (b). As shown in FIGS. 9(a) and (b), an n-GaAs layer 21 is grown epitaxially on a crystal growth layer 2 of semi-insulative GaAs. On both sides of the layer 2 there are formed a source electrode 4S and a drain electrode 4D. A gate electrode 4G comprises a Ti layer 41 and a W layer 42. The gate electrode 4G is in ohmic contact with a p+-GaAs layer 22 formed between the n-GaAs layer 2 and the same. The J-FET has little increase in the gate leakage current due to temperatures rises and exhibits good temperature characteristics.

Figure 10:
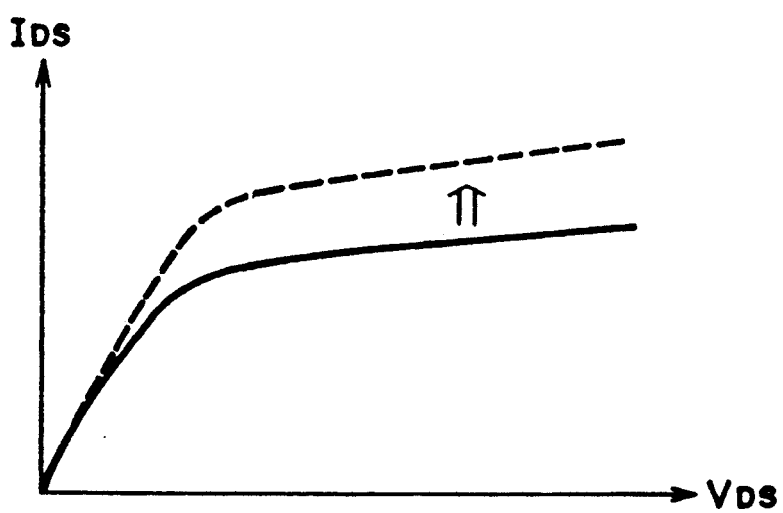
FIG. 10 is a current-voltage characteristic of the J-FET when a stress is applied thereto.

FIG. 10 shows an electrical characteristic of the J-FET due to changes of a stress. The source-drain voltages $V_{DS}$ of the J-FET are plotted on the horizontal axis. The drain current $I_{DS}$ thereof are plotted on the vertical axis. In the normal state, the current-voltage (I-V) characteristic is indicated by the solid line, but when a tensile stress is applied to the J-FET, the I-V characteristic changes to the dot line. A change of the threshold voltage as one example of changes of the electrical characteristics can be detected by the inverter circuit as explained with reference to FIG. 7(a).

Figure 11A:
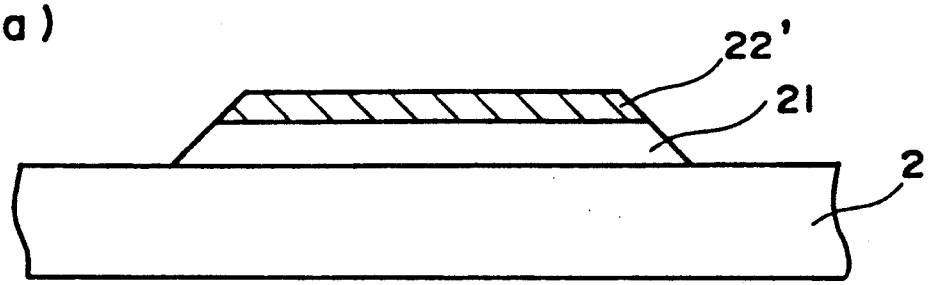
FIGS. 11(a)–(d) are sectional views of the J-FET used in this invention in its respective fabrication steps.
Figure 11B:
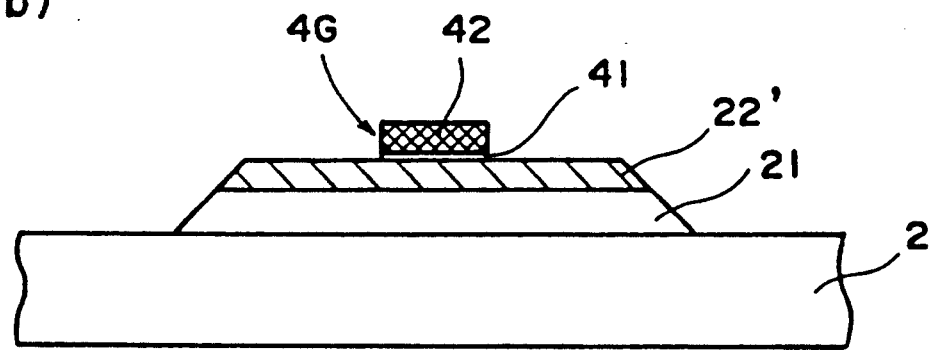
Figure 11C:
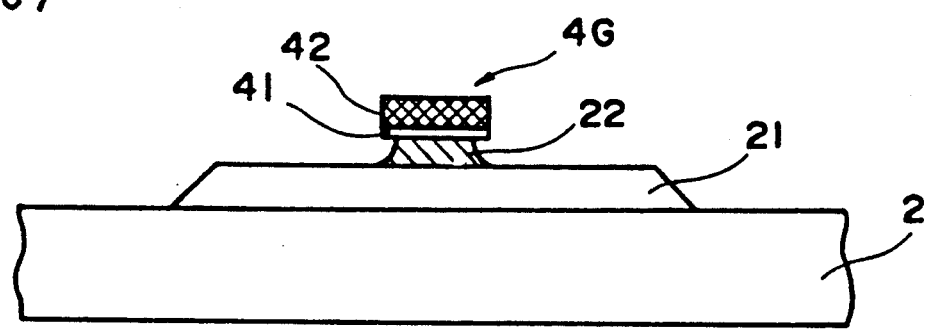
Figure 11D:
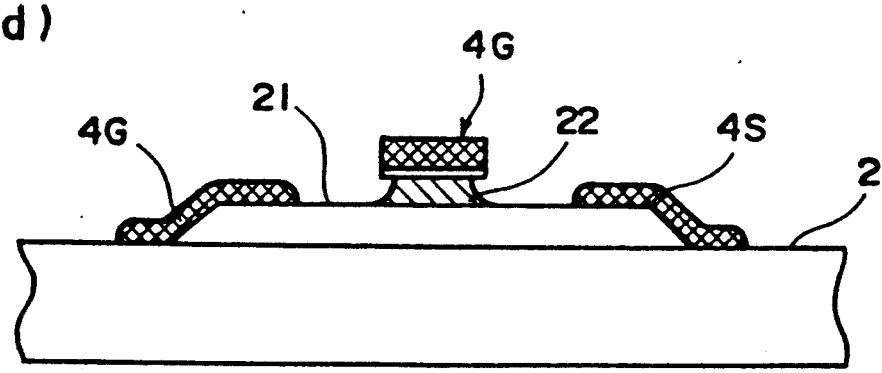

The J-FET (stress sensing FET 40) is fabricated by the process of FIGS. 11(a)–(d). An n+-GaAs and a p+-GaAs are epitaxially grown on a crystal growth layer 2 and etched off into a mesa as shown in FIG. 11(a). Then, a gate electrode 4G is formed by the lift-off (FIG. 11(a)). Then, with the gate electrode 4G as a mask the p+-GaAs layer 22' is etched off, and, as shown in FIG. 11(c), a gate region 22' is formed only below the gate electrode 4G. Again by the lift-off, a source electrode 4S and a drain electrode 4D are formed, and the J-FET used in this embodiment is completed.

Changes of the electrical characteristics of the FET due to a stress can be detected by driving the FET by the so-called constant-current drive. The following embodiments relates to semiconductor sensors having circuits of this type incorporated.

Figure 12:
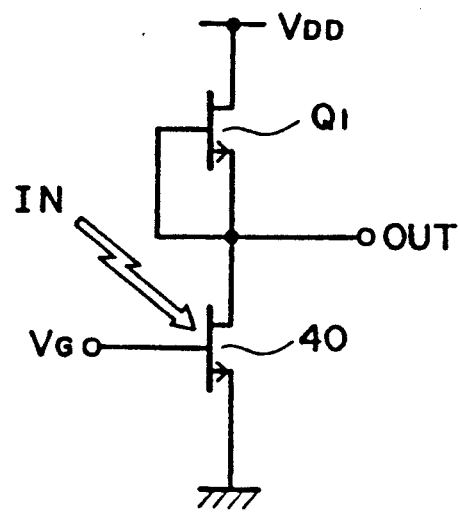
FIG. 12 is a circuit diagram of a constant-current driven-type semiconductor stress sensor according to one embodiment of this invention.

As shown in FIG. 12, a gate bias current $V_G$ is supplied to the gate of the stress sensing FET 40. The drain of the FET 40 is connected to the source of a MESFET $Q_1$. The drain of the MESFET $Q_1$ is connected to a power source $V_{DD}$. The source and the drain are short-circuited so that the MESFET functions as a constant-current source. As shown in FIG. 4(b), the stress sensing FET 40 is formed, e.g., at the proximal end of a cantilever, so that an input IN of a stress due to acceleration, mechanical vibrations or others is supplied to the stress sensing FET 40. This stress input IN changes a source-drain voltage $V_{DS}$ of the stress sensing FET 40, and a change of the voltage $V_{DS}$ is taken out by the circuit of FIG. 12 as an output signal OUT.

Figure 13:
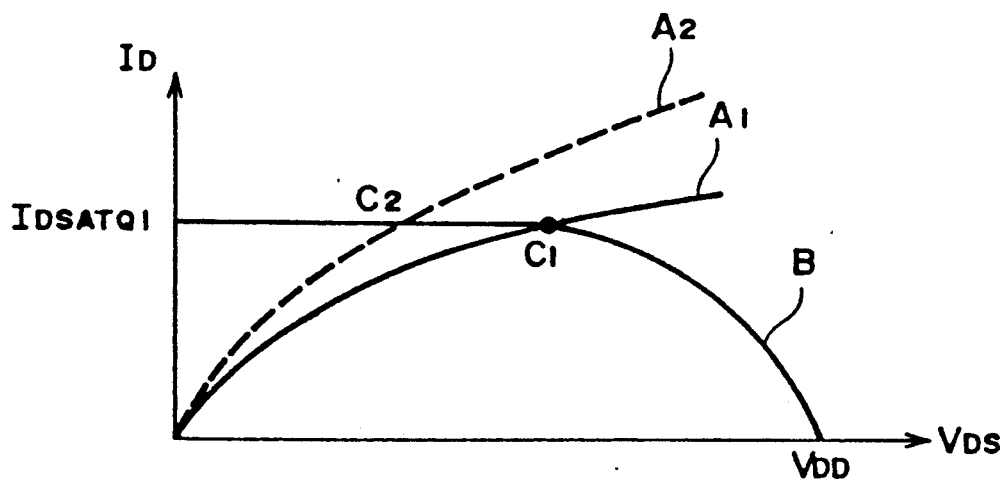
FIG. 13 is a current-voltage characteristic curve explaining the function of the circuit of FIG. 12.

FIG. 13 shows the operation of the circuit of FIG. 12 by the I-V characteristic. In FIG. 13, the solid curve B indicates a load line of the FET $Q_1$ as the constant-current source. The curves $A_1$ and $A_2$ shows current-voltage characteristics of the stress sensing FET 40. The solid curve $A_1$ indicates the I-V characteristic in the case that no stress is applied to. The dot-line curve indicates the I-V curve in the case that a tensile stress is applied to. As shown in FIG. 13, the operational point shifts from the point $C_1$ to the point $C_2$, which shows a large output signal OUT can be produced. In FIG. 12, $I_{DSATQ1}$ represents a saturated drain current value at the time when the gate-source voltage $V_{GS}$ of the FET $Q_1$ as the constant-current source is zero.

In the above-described embodiment, in order to increase the stress detecting sensitivity of the stress sensing FET 40, it is preferable to increase the gate length of the stress sensing FET 40. For example the gate length is set at 1.0 μm or less. On the other hand, in order to improve the function of the FET $Q_1$ for supplying a constant-current, it is preferable to make the gate length of the FET $Q_1$ larger relatively to that of the FET 40. High detection sensitivity can be obtained by setting the gate length of the FET $Q_1$ at 1.5 or more times (preferably 2-some times) that of the stress sensing FET 40.

The prior art detecting circuit has used a resistor element R in place of the FET $Q_1$ as the constant-current source. A disadvantage of the prior art is that large detected outputs cannot be produced. In improving the stress dependence of the I-V characteristic of the stress sensing FET 40 to thereby perform the detection with high precision, the gate length value has to be made small. But when this is realized in the prior art circuit, it is further difficult to increase the detected output because of occurrences of the so-called short channel effect. Since the drain current greatly changes depending on temperatures, the detection output greatly changes depending on temperatures when the short channel effect takes place. Japanese Patent Laid-Open Publication No. 105028/1983 describes a countermeasure to this temperature dependence, but the countermeasure comprises merely adjusting the gate-source bias voltage to thereby eliminate the temperature dependence.

Figure 14:
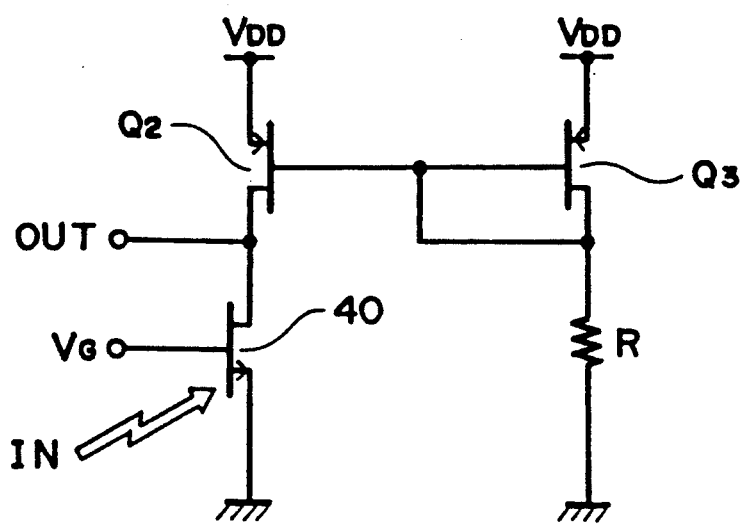
FIG. 14 is a circuit diagram of a constant-current driven-type semiconductor stress sensor according to one embodiment of this invention.
Figure 15:
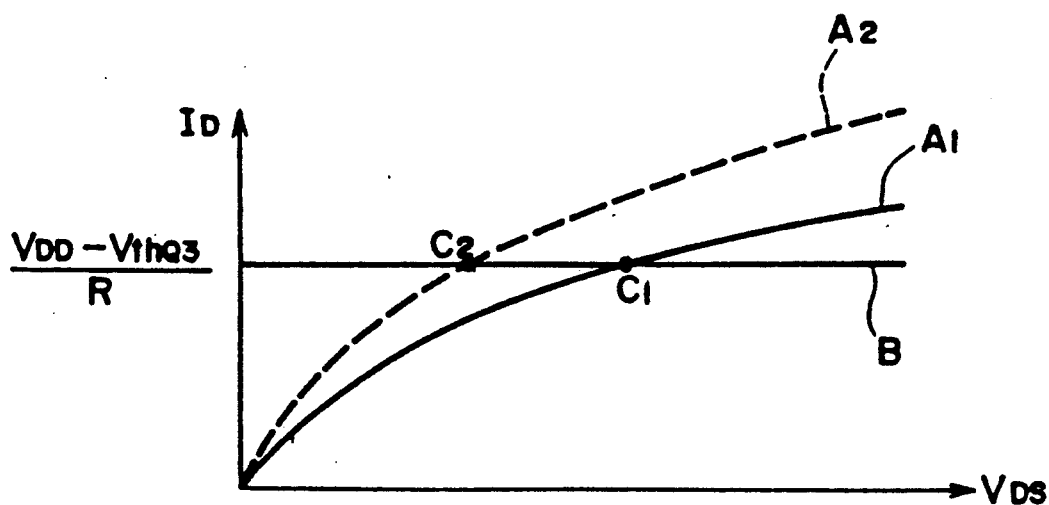
FIG. 15 is a current-voltage characteristic curve explaining the function of the circuit of FIG. 14.

The constant-current driven-type semiconductor sensor may have the circuit of FIG. 14. This circuit differs from the above-described embodiment in that a MESFET $Q_2$ formed between the drain of a stress sensing FET 40 and a power source $V_{DD}$ constitutes a current mirror circuit with another MESFET $Q_3$, and a resistor R is formed as a device for determining a value of the constant-current. In this circuit, a drain current $I_D$ to be supplied by the stress sensing FET 40 is $$I_D = (V_{DD} - V_{thQ3})/R$$

where a threshold voltage of the FET $Q_3$ is represented by $V_{thQ3}$. The I-V characteristic of the stress sensing FET 40 is shown in FIG. 15. The straight line B indicates a load line. When a stress input IN changes the characteristic of the stress sensing FET 40 from the curve $A_1$ to the curve $A_2$, the operational point shifts from the point $C_1$ to the point $C_2$. Accordingly, compared with the prior art circuit, the circuit according to this embodiment produces a far larger detected output.

Figure 16:
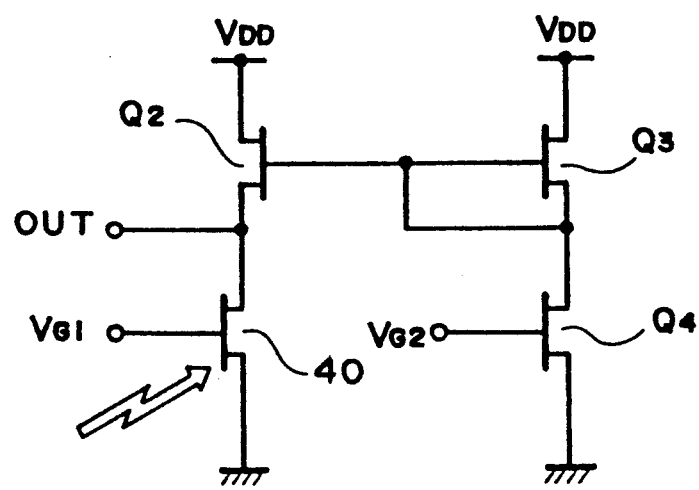
FIG. 16 is a circuit diagram of a constant-current driven-type semiconductor stress sensor according to one embodiment of this invention.

The constant-current driven-type semiconductor sensor may have the circuit of FIG. 16. A difference of this circuit from that according to the above-described embodiment is that a MESFET $Q_4$ which is formed in one and the same substrate in the same fabrication process is used. Gate bias voltages $V_{G1}$, $V_{G2}$ to be supplied to the respective gates of a stress sensing FET 40 and the FET $Q_4$ may be equal to or a little different from each other. In this circuit, a drain current $I_D$ to be supplied to the stress sensing FET 40 becomes equal to a saturated drain current $I_{DSATQ4}$ of the FET $Q_4$.

Figure 17:
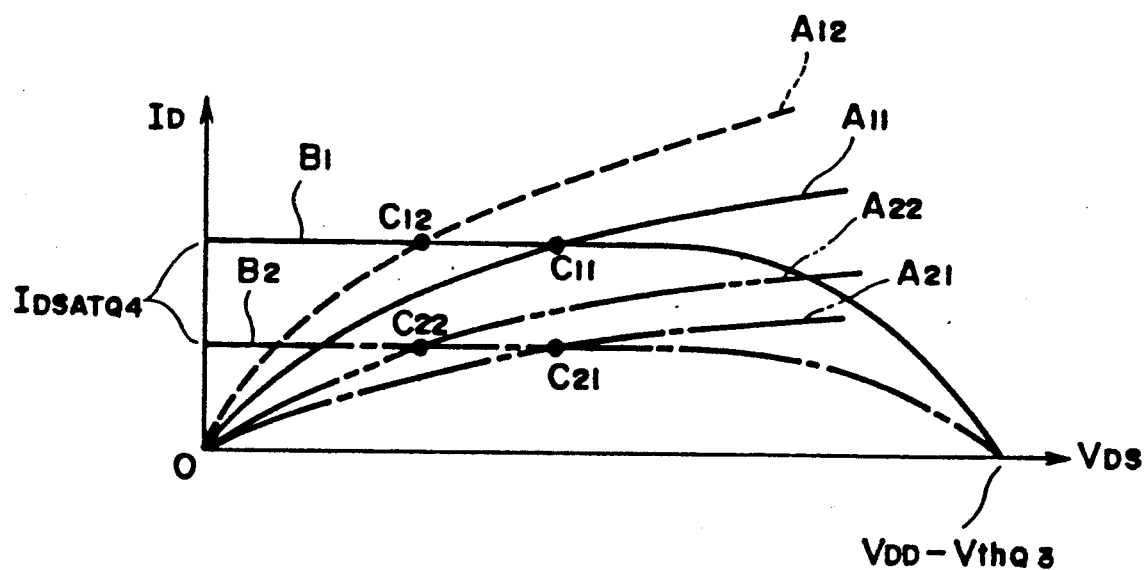
FIG. 17 is a current-voltage characteristic curve explaining the function of the circuit of FIG. 16.

The I-V characteristic of the stress sensing FET 40 is shown in FIG. 17. In FIG. 17, the solid curve $B_1$ indicates a load line at a temperature $T_1$. The solid curve $A_{11}$ indicates the I-V characteristic of the stress sensing FET 40 at a temperature $T_1$. The dot curve $A_{12}$ indicates the I-V characteristic generated when a stress is applied to at a temperature of $T_1$. As shown, the occurrence of a stress shifts the operational point from the point $C_{11}$ to the point $C_{12}$, which shows that a large detected output is produced. Such characteristic shifts from the curve $B_1$ to the curve $B_2$, from the curve $A_{11}$ to the curve $A_{21}$, and the curve $A_{12}$ to the curve $A_{22}$ when a temperature changes from $T_1$ to $T_2$ ($T_1 > T_2$). When a temperature rises ($T_1 < T_2$), the characteristic shifts conversely to the above. Thus, the load lines $B_1$, $B_2$ shift depending on temperatures as the characteristics of the stress sensing FET 40 does. This is because the same MESFET $Q_4$ as the stress sensing FET 40 is used as a device for determining a load current in the mirror current circuit. Accordingly, even when a large temperature change takes place, the operational points $C_1$, $C_2$, ($C_{11}$, $C_{12}$, $C_{11}$, $C_{22}$) as well shift, and resultantly a large detected output independent of temperatures can be produced. In this embodiment as well, it is preferably to shorted the gate length of the stress sensing FET 40 for improving the stress detecting sensitivity thereof. On the other hand, in order to improve the constant-current characteristic of the FET $Q_4$, it is preferably to make the gate length of the FET $Q_4$ larger relatively to that of the stress sensing FET 40. High stress detecting sensitivity can be realized by making the gate length of the FET $Q_4$ 1.5 or more times (preferably 2—some times) the gate length of the stress sensing FET 40. Such gate length setting can be performed by changing a mask pattern in a fabrication step.

Figure 18A:
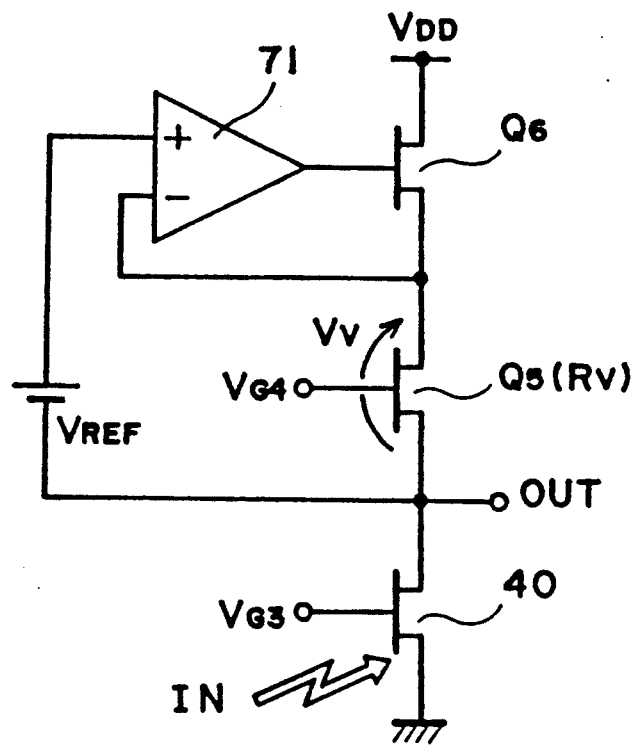
FIGS. 18(a) and (b) are circuit diagrams of constant-current driven-type semiconductor stress sensors according to embodiments of this invention.

The constant-current driven-type semiconductor sensor may have the circuits of FIGS. 18 (a) and (b). As shown, when a stress input IN is supplied to, the stress sensing FET 40 is connected to a MESFET $Q_5$ for the temperature compensation. A MESFET $Q_6$ for the current control is formed between the FET $Q_5$ and a power source $V_{DD}$. The gate of the MESFET $Q_6$ is connected to the output terminal of an operational amplifier 71. The non-invertible input terminal (+) of the operational amplifier 71 is connected to a reference voltage source $V_{REF}$. In the circuit of FIG. 18(a), the FET $Q_6$ is so controlled that the operational amplifier 71 has $V_{REF} = V_V$ where a source-drain potential difference of the FET $Q_5$ is represented by $V_V$, and a source-drain resistance is represented by $R_V$. Resultantly the drain current $I_D$ becomes constant. That is, $$V_{REF} = I_D \cdot R_V.$$

Therefore $$I_D = V_{REF}/R_V.$$

The equivalent resistance value of the stress sensing FET 40 changes due to temperature drifts. But the temperature compensation is made by changing a gate bias voltage $V_{G4}$ of the FET $Q_5$.

Figure 18B:
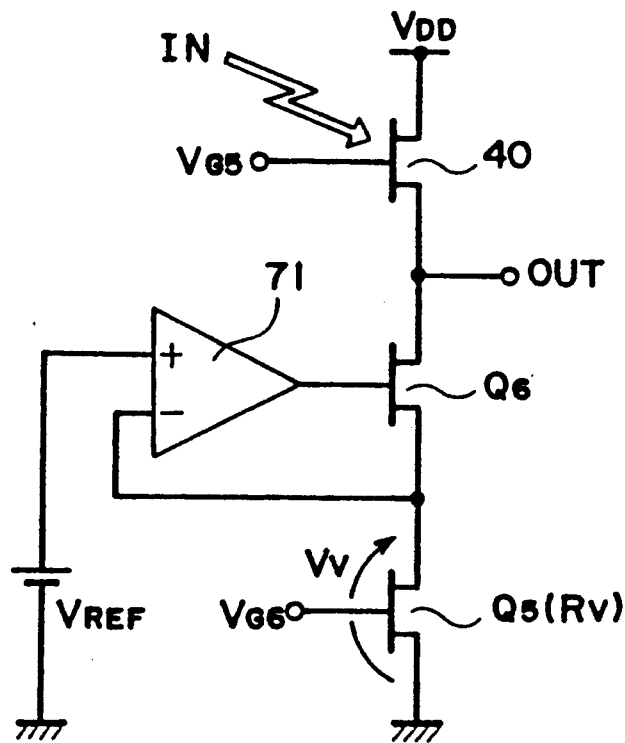
Figure 19:
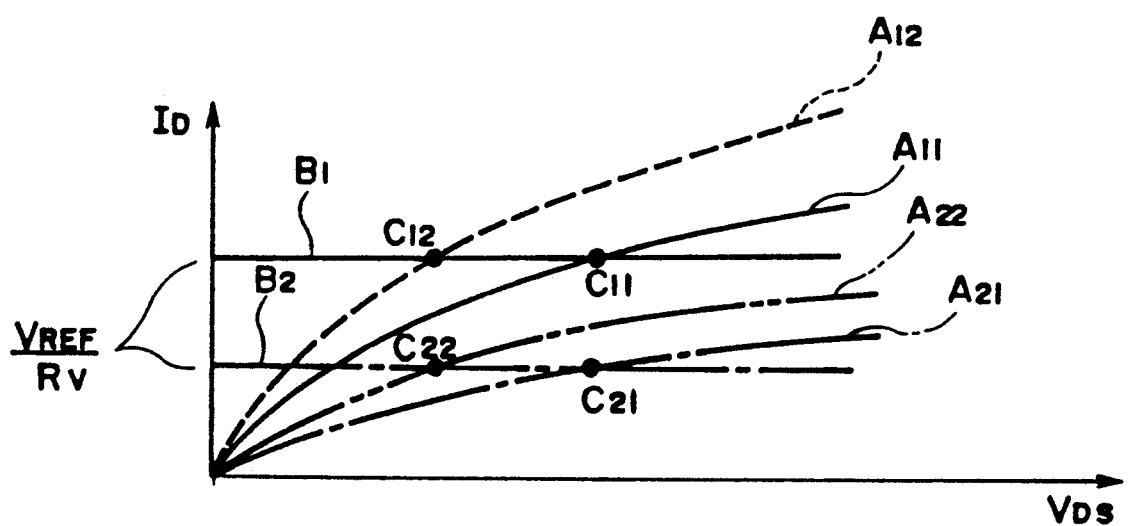
FIG. 19 is a current-voltage characteristic curve explaining the functions of the circuits of FIG. 18.

FIG. 19 shows this temperature compensation by the I-V characteristic of the stress sensing FET 40. The curve $A_{11}$ indicates the I-V characteristic of the stress sensing FET 40 at a temperature of $T_1$. the curve $A_{12}$ indicates the I-V curve at a temperature of $T_1$ when a stress is applied to, and a load line at this time is indicated by the straight line $B_1$. It is seen that the operational point shifts from $C_{11}$ to $C_{12}$, and a large detected output can be produced. When a temperature decreases from $T_1$ to $T_2$, the curve $A_{11}$ shifts to the curve $A_{12}$, and the curve $A_{12}$ shifts to $A_{22}$. At the same time, the load line $B_1$ shifts to the load line $B_2$ by changing a gate bias voltage $V_{G4}$ of the FET $Q_5$. That is, the operational point shifts from the point $C_{21}$ to the point $C_{22}$, and a large detected output independent of the temperature can be produced. The circuit of FIG. 18(b) performs the same operation as that of FIG. 18(a). In the circuit of FIG. 18(b), the temperature compensation is made by changing a gate bias voltage $V_{G6}$ to the FET $Q_5$.

Changes of the electrical characteristics of the FET due to a stress can be detected by driving the FET by the so-called constant-voltage drive. The following embodiments relates to semiconductor sensors having the circuit of this type incorporated.

Figure 20:
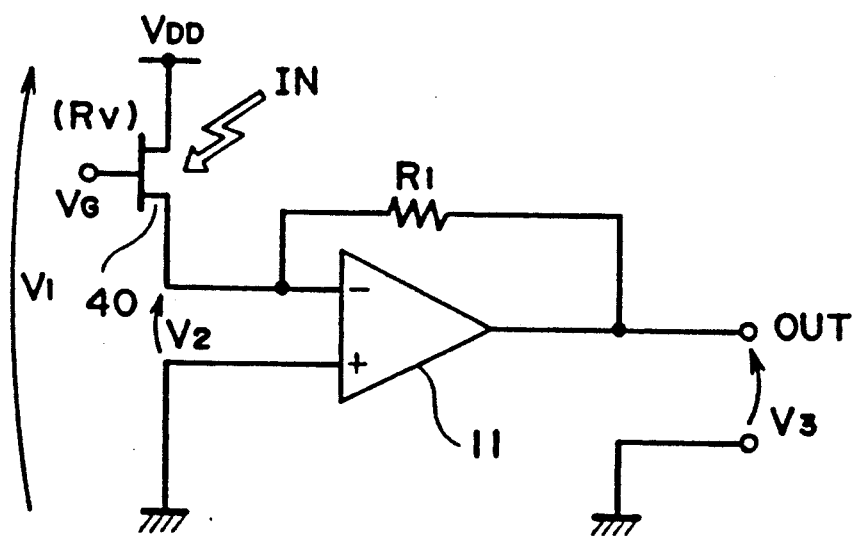
FIG. 20 is a circuit diagram of a constant-voltage driven-type semiconductor stress sensor according to one embodiment of this invention.

As shown in FIG. 20, a stress sensing FET 40 is connected at the source to the invertible input terminal (−) of an amplifier 11, at the drain to a power source $V_{DD}$ and at the gate to a terminal for supplying a gate bias voltage $V_G$. The non-invertible input terminal (+) of the amplifier 11 is grounded. An output signal OUT is taken out at the output terminal of the amplifier 11. The stress sensing FET 40 is formed on a cantilever as shown in, e.g., FIG. 4(b) so that a stress due to acceleration or others is applied as a stress input IN to the stress sensing FET 40. In the circuit of FIG. 20, if a potential difference between the invertible input terminal (−) and the non-invertible input terminal (+) is $V_2$, the potential difference $V_2$ can be regarded as zero. Then, when a potential difference between the power source $V_{DD}$ and the earth is $V_1$, a constant voltage $V_1$ is always supplied between the source and the drain of the stress sensing FET 40. Accordingly, when a voltage level of an output signal OUT is $V_3$, a resistance value between the source and the drain of the stress sensing FET 40 is $R_V$, and a drain current is $I_D$, $V_3/V_1 = -R_1/R_V$, and
since
$V_1 = R_V \cdot I_D$,
$V_3 = -(R_1/R_V) \cdot V_1$
$= -I_D \cdot R_1$.

Figure 21A:
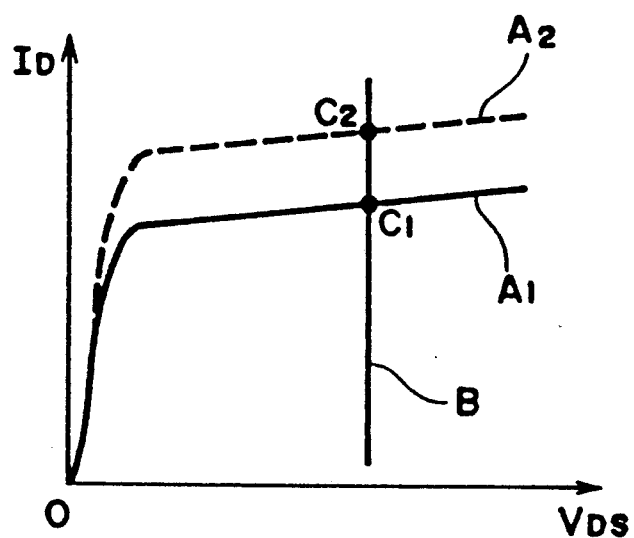
FIGS. 21(a) and (b) are characteristic curves explaining the function of the circuit of FIG. 20.
Figure 21B:
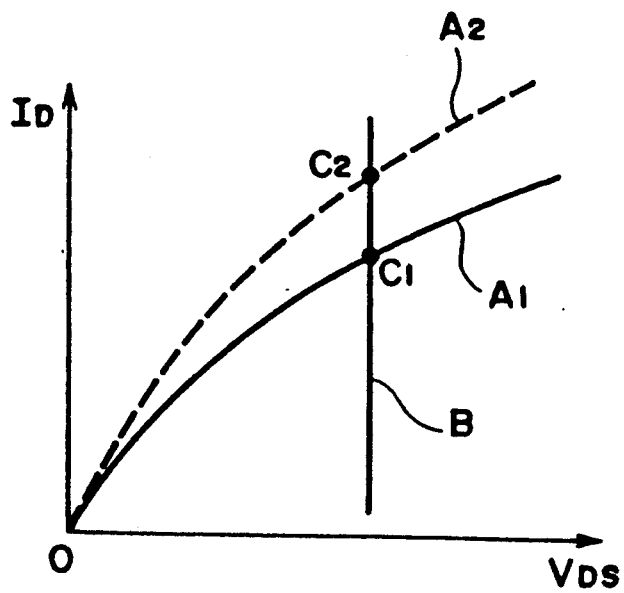

This relationship is shown by I-V characteristic in FIGS. 21 (a) and (b). FIG. 21(a) shows the I-V characteristic for the case the short channel effect does not take place in the stress sensing FET 40. FIG. 21(b) shows the I-V characteristic for the case the drain current is not sufficiently saturated because of the short channel effect. The solid curve $A_1$ indicates the $V_{DS}$ dependence of the drain current $I_D$ for the case a stress is at zero level. The dot curve $A_2$ indicates the $V_{DS}$ dependence of the drain current $I_D$ for the case a tensile stress is applied to. The solid straight line B is a load line. As shown, the operational point shifts from the point $C_1$ to the point $C_2$, and it is seen that a sufficiently large detected output can be produced even when the short channel effect is present, In this embodiment, a constant voltage is supplied between the source and the drain of the stress sensing FET 40, and a change of the drain current $I_D$ occurring when a stress is applied to is current-voltage converted to be supplied as a detection output. Accordingly, a large detection output which is free from the influences of the short channel effect and environment temperatures can be produced as a voltage signal.

Figure 22:
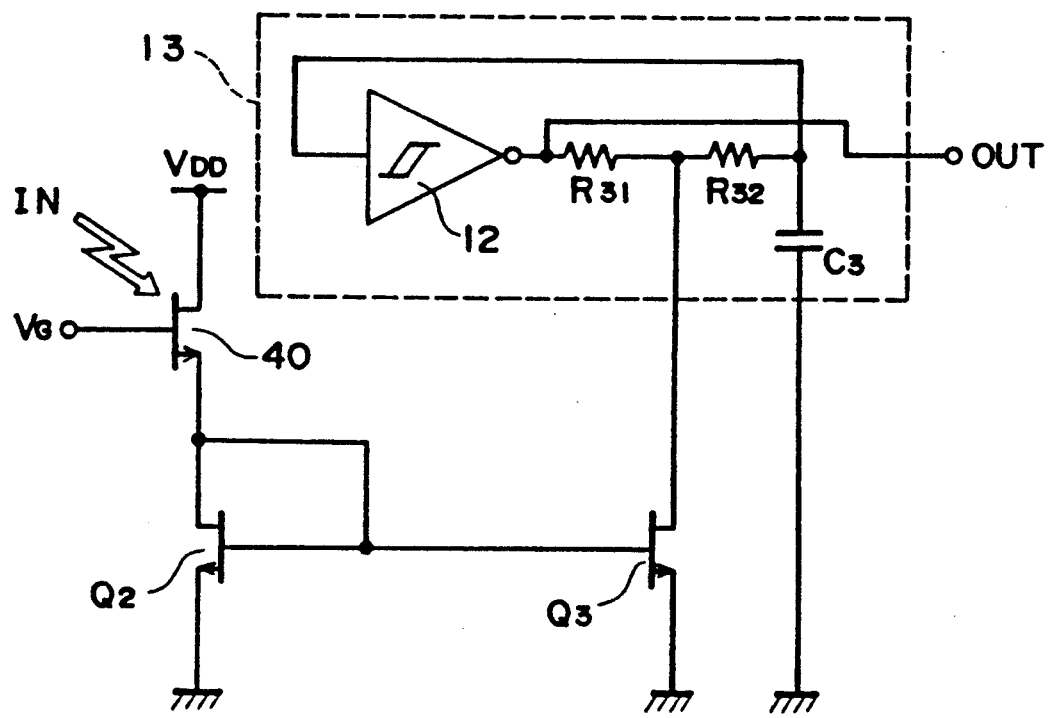
FIG. 22 is a circuit diagram of a constant-voltage driven-type of semiconductor stress sensor according to one embodiment of this invention.

An embodiment in which a detected output is outputted as a frequency signal will be explained with reference to FIG. 22.

In this embodiment, the drain of a stress sensing FET 40 is supplied with a power source $V_{DD}$, the gate thereof is supplied with a gate bias voltage $V_G$, and the source thereof is connected to a MESFET $Q_2$ having the gate and the drain short-circuited. The gate of the MESFET $Q_2$ is connected to the gate of a MESFET $Q_3$ having the source grounded. An oscillation circuit 13 is constituted by a Schmitt trigger inverter 12 having two different thresholds, i.e., hysteresis, resistors $R_{31}$, $R_{32}$ serially connected on the output side of the inverter 12, and a capacitor $C_3$ inserted between an output terminal and an earth. The node between the resistors $R_{31}$, $R_{32}$ is connected to the FET $Q_3$.

In the above-described circuit, since the gate and the drain of the FET $Q_2$ are short-circuited, a source-drain voltage is equal to a threshold voltage $V_{th}$ of the FET $Q_2$. Accordingly, a required d.c. voltage $(V_{DD}-V_{th})$ is supplied between the source and the drain of the stress sensing FET 40. Thus with a substantially constant voltage $(V_{DD}-V_{th})$ supplied between the source and the drain of the stress sensing FET 40, when a stress is applied to, a drain current $I_D$ changes in accordance with a level of the stress as shown in FIG. 21(a) and (b). Consequently a gate potential of the MESFET $Q_3$ changes, and a current flowing through the FET $Q_3$ changes. Then a frequency of the oscillation circuit 13 constituted by the Schmitt trigger inverter 12, the resistors $R_{31}$, $R_{32}$, and the capacitor $C_3$ also changes.

Figures 23A, 23B:
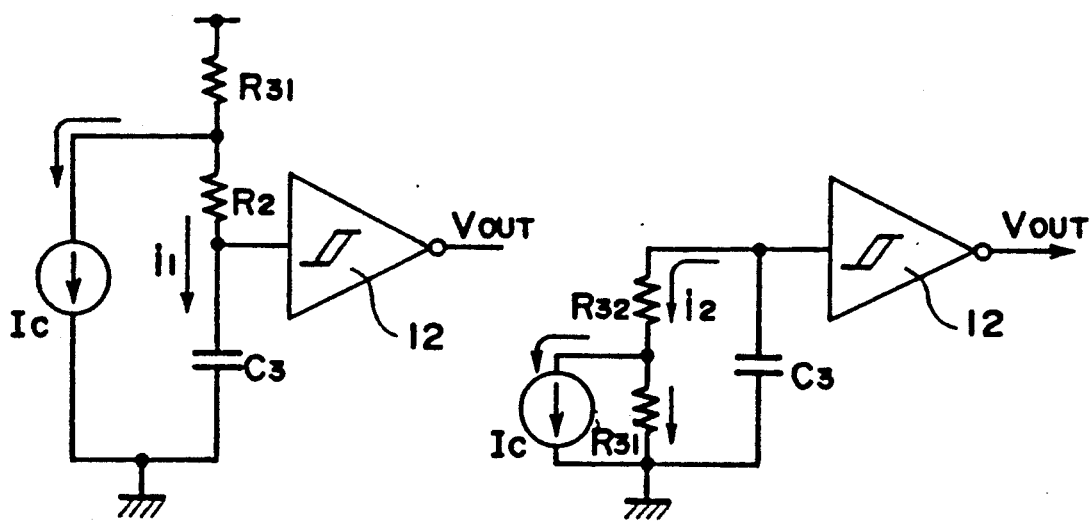
FIGS. 23(a) and (b) are diagrams of equivalent circuits of the circuit of FIG. 22.

FIG. 23(a) and (b) show the oscillation of the oscillation circuit 13 in equivalent circuits. FIG. 23(a) shows the state in which an output voltage $V_{out}$ is of high level. FIG. 23(b) shows the state in which the output voltage $V_{out}$ is of low level. As shown in FIG. 23(a), when the output voltage $V_{out}$ is of high level, a current $i_1$ flows through the capacitor $C_3$, and the capacitor $C_3$ is charged with the current, an input level of the Schmitt trigger inverter 12 gradually goes up. When the input level of the Schmitt trigger inverter 12 exceeds a first threshold level, the output voltage $V_{out}$ is inverted to the low level, and the oscillation circuit 13 is switched to the state of FIG. 23(b). Then, a current i2 flows, and thus the electric charge of the capacitor $C_3$ is discharged, and the input level of the Schmitt trigger inverter 12 gradually goes down. When the input level of the Schmitt trigger inverter 12 becomes lower than a second threshold level, the output voltage $V_{out}$ is inverted from the low level to the high level, and the inverter 12 is switched again to the state of FIG. 23(a). Thus, the Schmitt trigger inverter 12 has two threshold levels, so that its output voltage $V_{out}$ is switched between the high and the low levels to oscillate pulses at a required frequency. A constant current $I_C$ in the circuits of FIGS. 23(a) and (b) is supplied by the FET $Q_3$ in the circuit of FIG. 22. This constant current $I_C$ changes in accordance with an stress input IN applied to the stress sensing FET 40. That is, when the level of a stress applied to the stress sensing FET 40 changes, a value of the constant current $I_C$ changes. Accordingly the charge and the discharge of the capacitor $C_3$ differ in time, so that the oscillation frequency changes in accordance with a level of a stress. At this time, a constant bias is being continuously supplied between the source and the drain of the stress sensing FET 40, so that even when the short channel effect takes place because of a short gate length of the stress sensing FET 40, an large detected output can be produced independent of temperatures.

Figure 24:
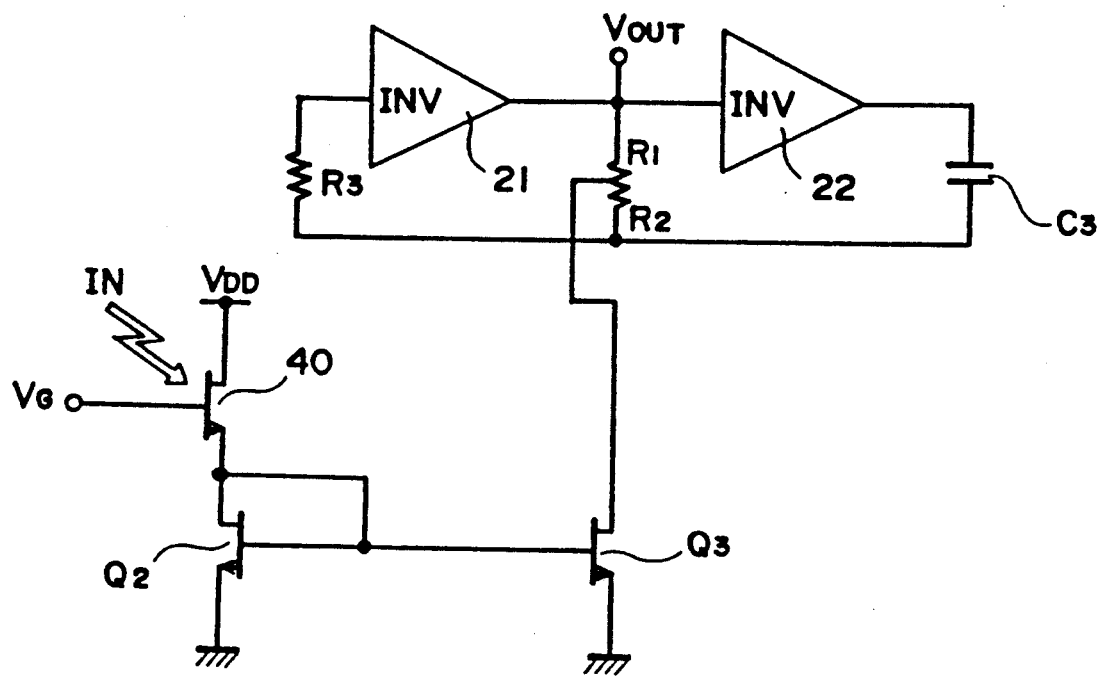
FIG. 24 is a circuit diagram of a constant-voltage driven-type semiconductor stress sensor according to one embodiment of this invention.
Figure 25A:
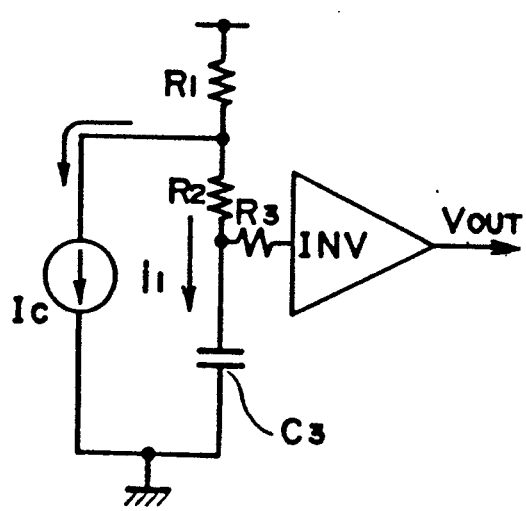
FIGS. 25(a) and (b) are diagrams of equivalent circuits of the circuit of FIG. 24.

FIGS. 24, and 25(a) and (b) show modifications of the above described embodiment. The circuit of FIG. 24 differs from that of FIG. 22 in that an oscillation circuit is constituted by two usual inverters (INV) 21, 22 in place of the Schmitt trigger inverter 12. In the circuit of FIG. 24, a source-drain voltage of a FET $Q_2$ is equal to the threshold voltage, so that the source-drain voltage of the stress detecting FET 40 is constant. When a stress is applied to the stress sensing FET 40, a current flowing through the FET $Q_3$ changes, and a change of the current changes a frequency of the oscillation circuit.

Figure 25B:
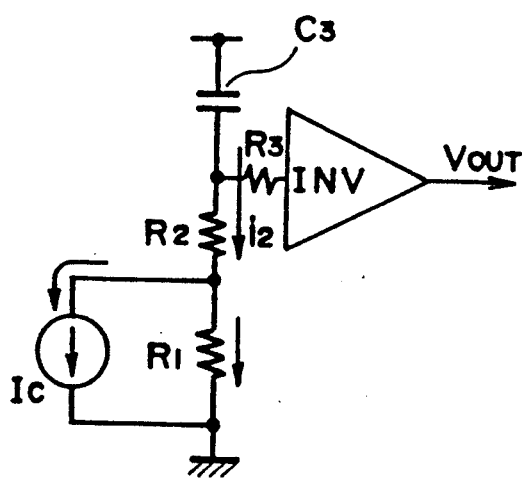

FIGS. 25(a) and (b) shows this in equivalent circuits. FIG. 25(a) shows the state where an output voltage $V_{out}$ is of high level. FIG. 25(b) shows the state where an output voltage $V_{out}$ is of low level. As shown in FIG. 25(a), when an output voltage $V_{out}$ is of high level, the capacitor $C_3$ is charged with a current $i_1$, and the output voltage $V_{out}$ is inverted to the low level. Then, the state of FIG. 25(b) follows, and electric charge of the capacitor $C_3$ is discharged by a current $i_2$. At this time, a charge and a discharge times of the capacitor $C_3$ is changed by a constant current $I_C$, so that a change of an oscillated frequency indicates a change of a level of a stress. In the circuit of FIG. 24, a resistor may be inserted on the side of the output of the inverter 22, and a FET may be inserted between this resistor and the capacitor $C_3$. In the semiconductor sensor according to this invention, the circuit of FIG. 20 may be provided parallelly in a pair. In this case, in one of the pair of the circuits, the stress sensing FET 40 is formed at a position where no stress is applied to. In the other of the pair of the circuits, the stress sensing FET 40 is formed at a position where a stress is applied to. By obtaining a difference between outputs of the thus arranged circuits, an output signal which is perfectly independent of temperatures can be produced.

When a stress is applied to a FET, the FET changes not only the threshold voltage but also the transconductance ($g_m$). The embodiment which will be described below relates to a semiconductor sensor which detects a stress, based on a change of the transconductance. This sensor has a stress sensing FET formed in the same arrangement as in the sensor of FIG. 4(a). A stress caused by a bend of a crystal growth layer (an elastically deformable member) 2 changes a transconductance $g_m$ of the stress sensing FET 4. Accordingly the acceleration indicated by G in FIG. 4(a) can be detected.

Figure 26:
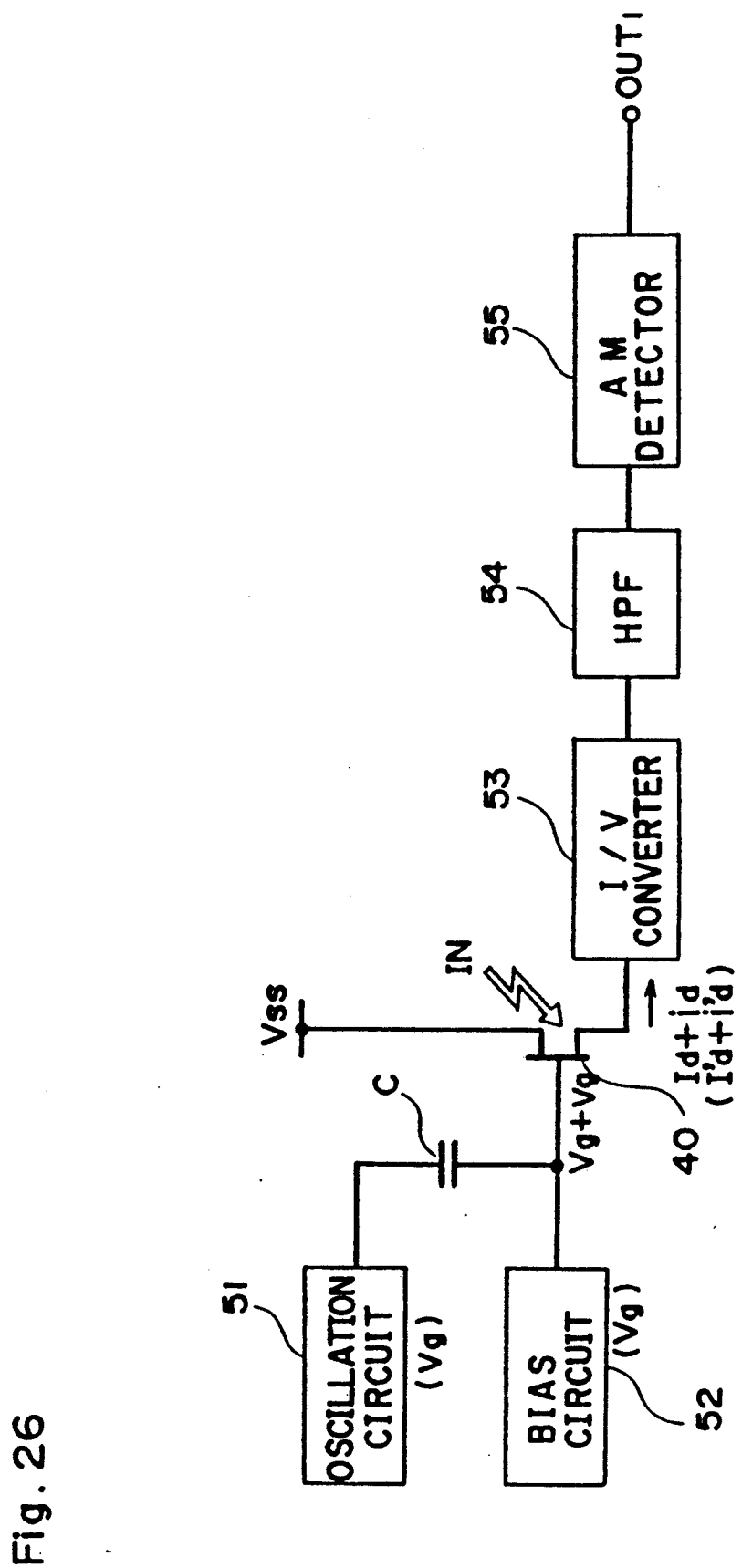
FIG. 26 is a circuit diagram of an a.c. signal input-type semiconductor sensor according to one embodiment of this invention.

FIG. 26 shows a circuit of the semiconductor sensor according to this embodiment. A stress sensing FET 40 to which a stress is applied is connected at the gate parallelly to an oscillation circuit 51 for supplying an a.c. signal $v_g$ through a d.c. blocking condenser C and to a bias circuit 52 for supplying a d.c. bias $V_g$. The stress sensing FET 40 is connected at the source to a power source $V_{ss}$. Through the drain of the stress sensing FET 40 flows a drain current $I_{DS}$, $I_d+i_d$ ($I_d'+i_d'$) where $I_d$ represents a current component corresponding to a d.c. bias $V_g$, $i_d$ represents a current component corresponding to an a.c. signal $v_g$, and $I_d'$ and $i_d'$ represent current components of these current components obtained when a stress is applied to. The drain of the stress sensing FET 40 is connected to an I/V converting circuit 53, a HPF 54 and an amplitude modification detecting circuit 55 (AM detecting circuit). The I/V converting circuit 53 converts an output current (a drain current $I_{DS}$) of the stress sensing FET 40 into a voltage signal. The HPF 54 is a high-frequency pass filter for blocking a low-frequency component to take out a high-frequency component. The AM detecting circuit 55 AM-detects an a.c. signal to output a stress detection signal $OUT_1$.

Figure 27:
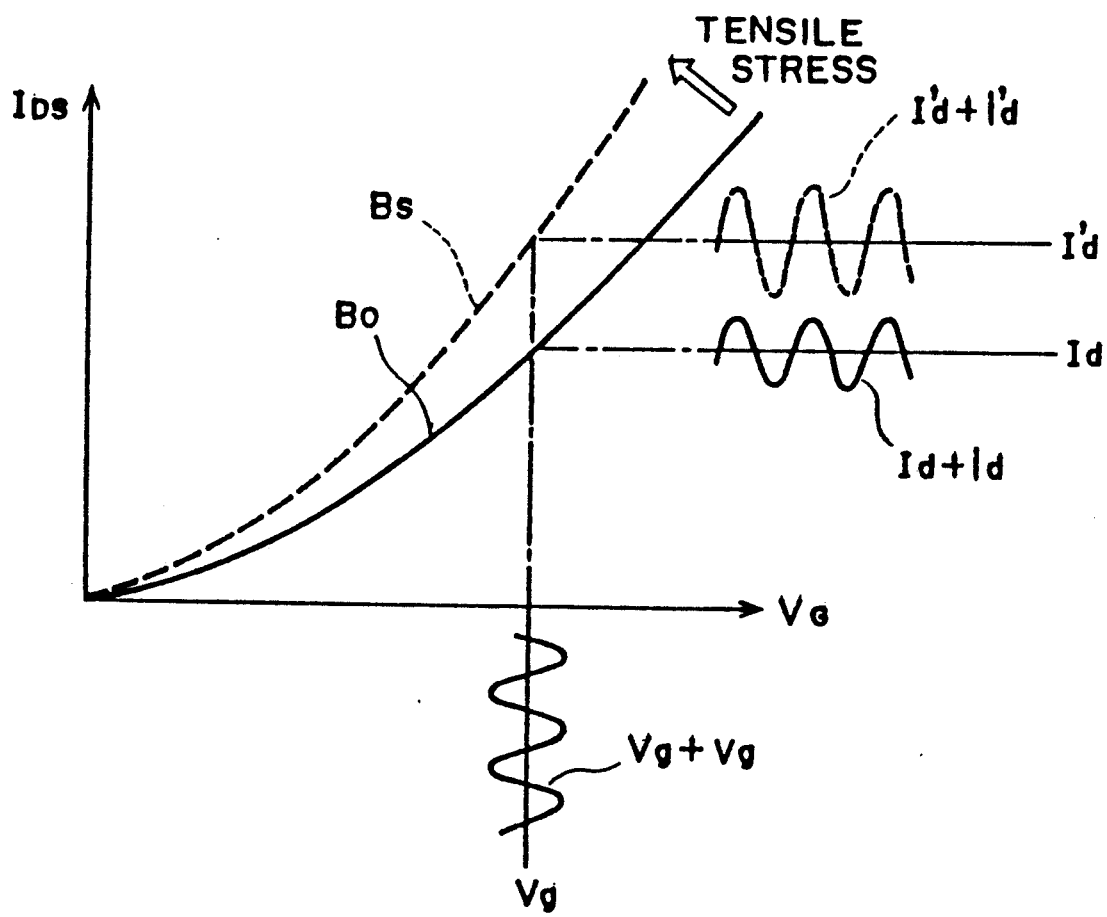
FIG. 27 is a current-voltage characteristic curve of the semiconductor sensor of FIG. 26.

FIG. 27 shows the function of the circuit according to this embodiment. With the gate voltage $V_G$ plotted on the horizontal axis, and the drain current $I_{DS}$ plotted on the vertical axis, the characteristic of the stress sensing FET 40 is indicated by the solid curve $B_0$ in FIG. 27. In this state, when a stress is applied to the stress sensing FET 40, the transconductance $g_m$ changes. For example, when a tensile stress is applied to, the dot curve $B_s$ in FIG. 27 is obtained. Accordingly, when the gate voltage $V_G=V_g+v_g$ is as shown in FIG. 27, the drain current $I_{DS}$ is $I_d+i_d$ as shown when a stress is of zero level. The current $I_{DS}$ is $I_d'+i_d'$ as shown when a stress is applied to.

The current $I_{DS}$ of the stress sensing FET 40 is converted into a voltage signal by the I/V converting circuit 53, and a d.c. component and a low-frequency noise component of the converted voltage signal are removed. Accordingly, components supplied to the AM detecting circuit 55 are a.c. components of the drain current $I_{DS}$, i.e., a component corresponding to levels of $i_d$, $i_d'$ in FIG. 27. It is seen from FIG. 27 that the amplitudes of the a.c. component $i_d$, $i_d'$ change in accordance with a stress. Accordingly, by AM detecting the a.c. components $i_d$, $i_d'$, an output corresponding to the level of a stress can be produced as a detected signal $OUT_1$.

In the above-described embodiment, since a stress is detected in a change of a transconductance $g_m$ occurred when a stress is applied to the stress sensing FET 40, very high sensitivity can be obtained easily. Since an a.c. signal is applied to the gate of the stress sensing FET 40 to detect a change of an a.c. component of the drain current $I_{DS}$, drifts of the drain current $I_{DS}$ and low-frequency noises can be removed by the HPF 54. Accordingly a wide dynamic range can be obtained.

Figure 28:
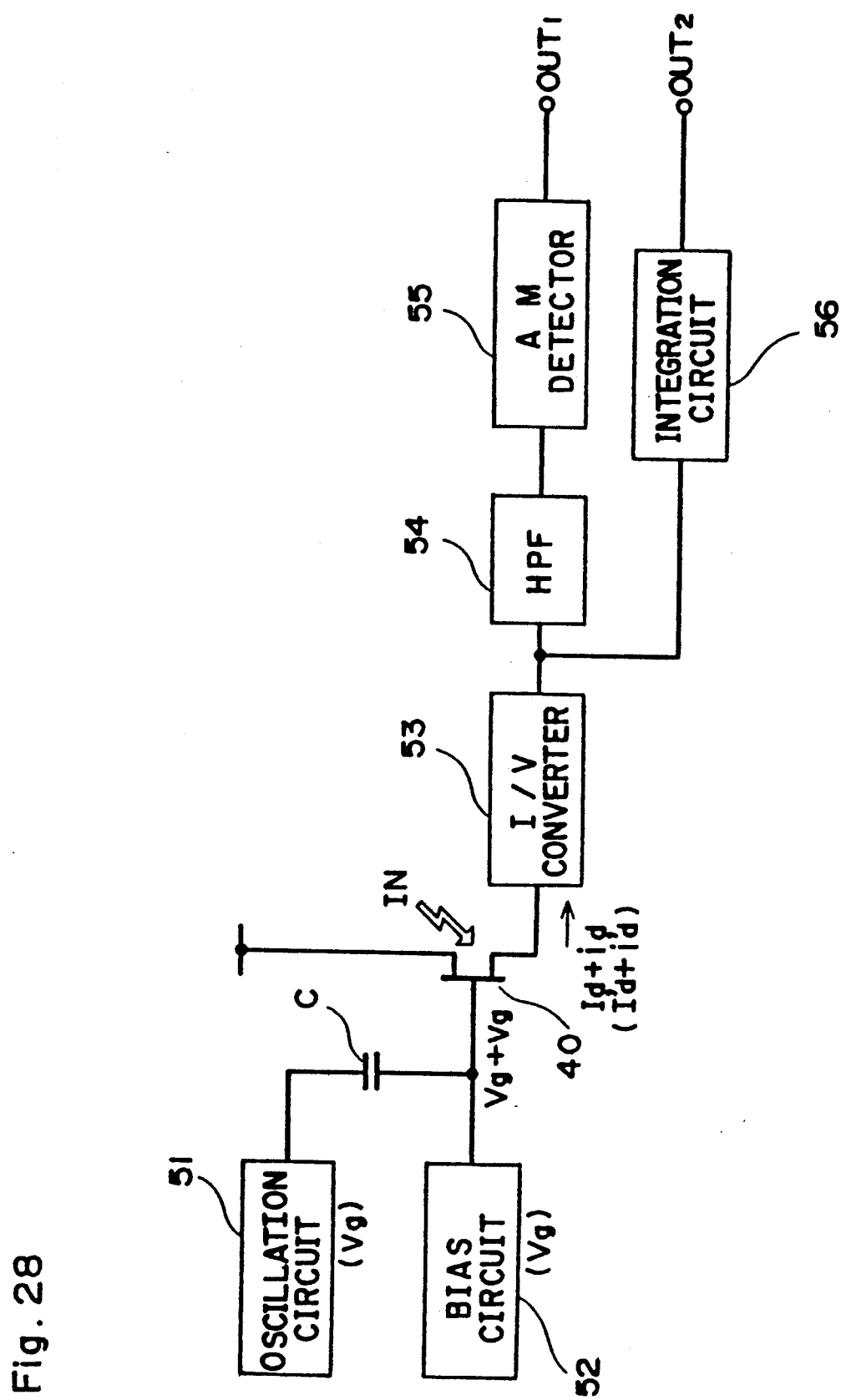
FIG. 28 is a circuit diagram of an a.c. signal input-type semiconductor sensor according to one embodiment of this invention.

The FET 40 in this embodiment has the current-voltage characteristic which changes in accordance with changes of temperatures. This permits a temperature to be sensed concurrently with the detection of a stress. The circuit according to this embodiment differs from the circuit according to the above-described embodiment in that, as shown in FIG. 28, an integration circuit 56 is inserted parallelly with a HPF 54 and an AM detecting circuit 55. The integration circuit 56 integrates an output of the I/V converting circuit 53 with a designed time constant and outputs the result as a temperature detected signal $OUT_2$. In this circuit, a change (due to a stress) of an a.c. component of a drain current $I_{DS}$ of the stress sensing FET 40 is detected by the HPF 54, and the AM detector 55, and a change (due to a change of a temperature) of a d.c. component is detected by the integration circuit 56.

Figure 29:
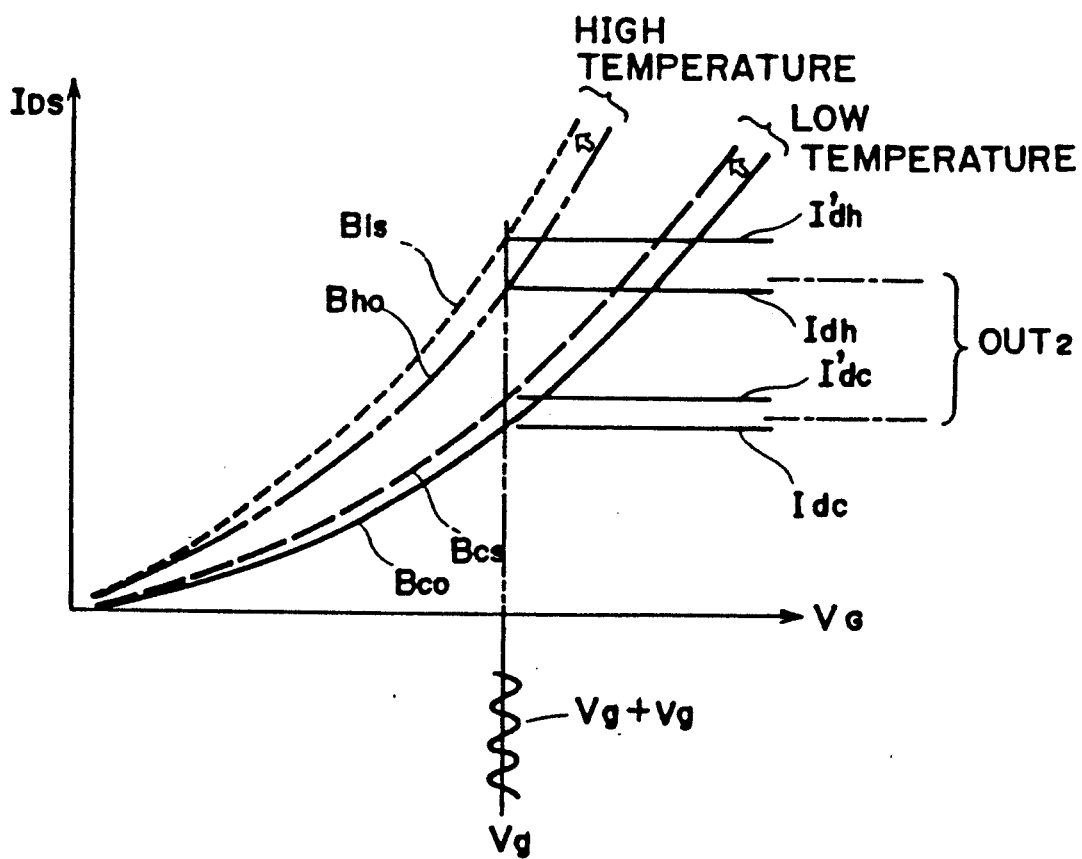
FIG. 29 is a current-voltage characteristic curve explaining the function of the semiconductor sensor of FIG. 28.

In FIG. 29, the curves $B_{co}$, $B_{cs}$, $B_{ho}$, $B_{hs}$ represent changes of a drain current $I_{DS}$ of the stress sensing FET 40 with respect to a gate voltage $V_G$ thereof. The curve $B_{co}$ indicates the state at low temperatures and with zero level of stress. The curve $B_{cs}$ indicates the sate at low temperatures with a stress. The curve $B_{ho}$ indicates the state at high temperatures with zero level of stress. The curve $B_{hs}$ indicates the state at high temperatures with a stress. When a gate voltage $V_G = V_g + v_g$ is supplied to the stress sensing FET 40 having such characteristics, a d.c. component of a drain current $I_{DS}$ at low temperatures changes between $I_{dc} - I_{dc}'$ in FIG. 29, and a d.c. component there at high temperatures change between $I_{dh} - I_{dh}'$. These d.c. components of the drain current $I_{DS}$ are converted to a voltage signal and then detected by the integration circuit 56 having a large time constant to be outputted as a temperature detected signal $OUT_2$. In this embodiment, a temperature and a stress are detected by the one and the same sensing FET 40 based on one and the same characteristic change, which enables the temperature compensation to be made accurately.

A stress generated in an elastically deformable member can be detected with high precision by forming two FETs in the elastically deformable portion to compute a difference between outputs thereof. The following embodiment relates to such semiconductor sensor.

Figure 30:
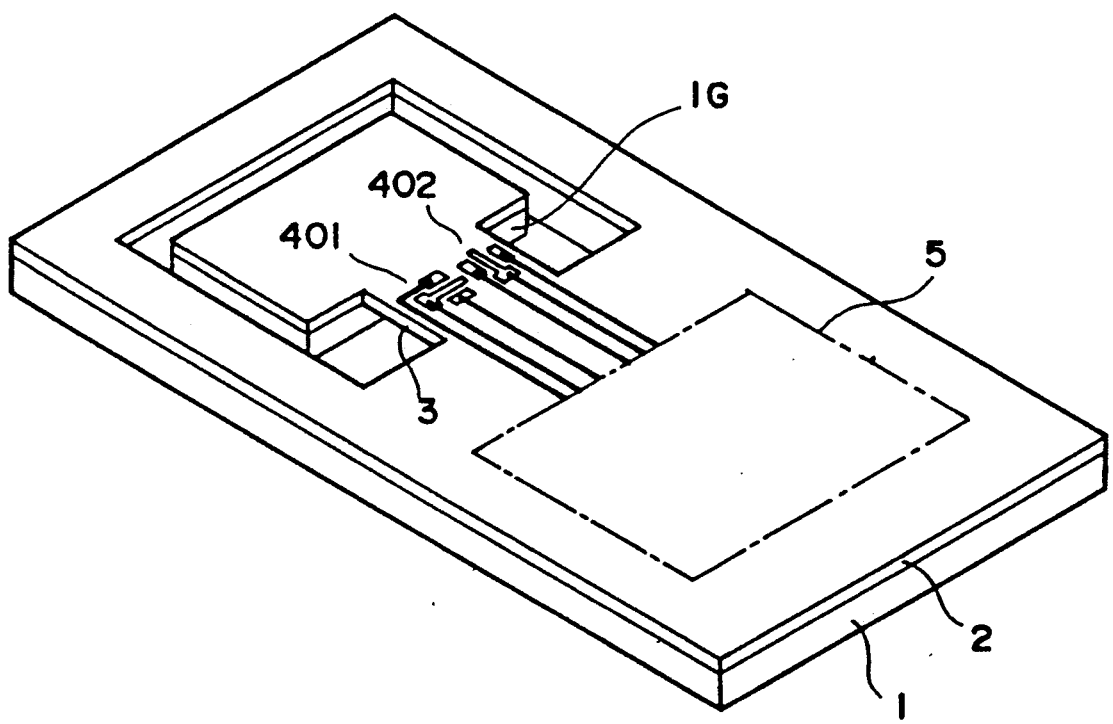
FIG. 30 is a perspective view of a differential type semiconductor sensor according to one embodiment of this invention.

As shown in FIG. 30, a pair of MESFETs 401, 402 are formed as stress sensing semiconductor devices at the proximal end of a cantilever 3. A signal processing circuit 5 is formed in a portion (a support) of a crystal growth layer 2 other than the cantilever 3. This signal processing circuit 5 is connected by signal line to the FETs 401, 402.

Figure 31:
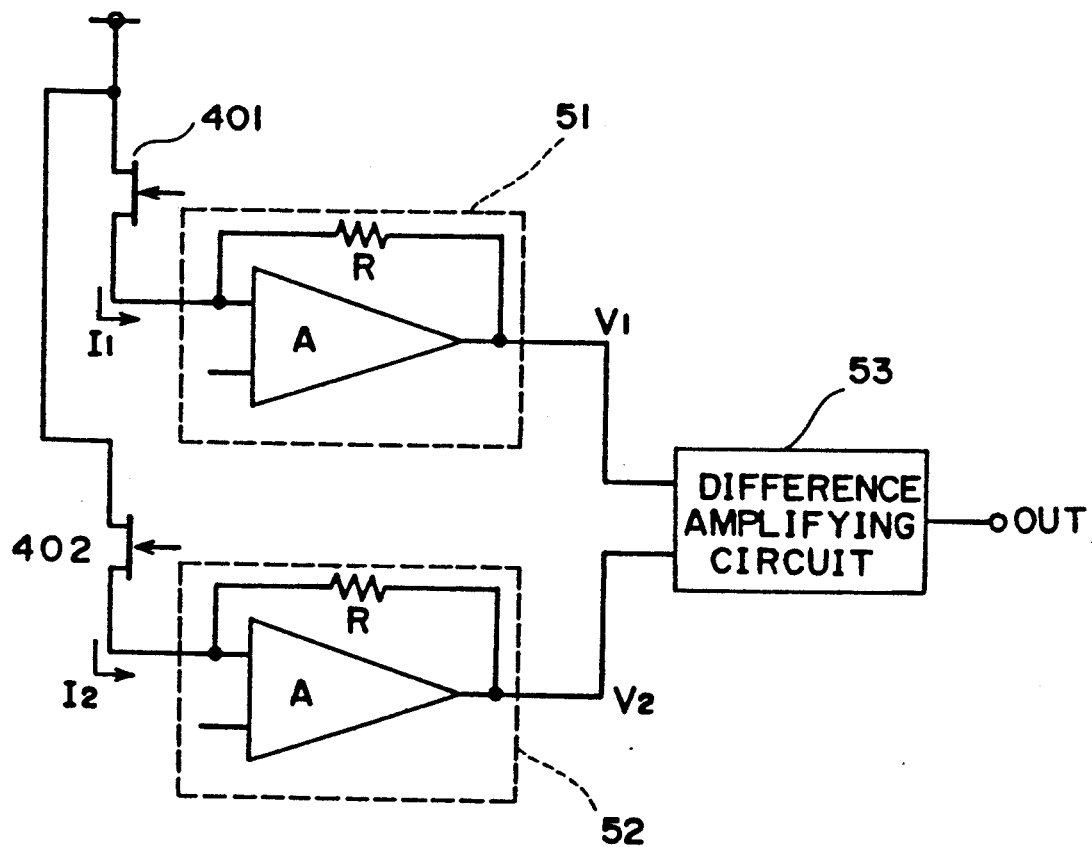
FIG. 31 is a circuit diagram of the sensor of FIG. 30.

FIG. 31 shows a circuit diagram of the sensor of FIG. 30. Each of the FETs 401, 402 formed at the proximal end of the cantilever 3 are connected at the drain to an I/V converting circuit 51 with an amplifier A and a feedback resistor 51, 52. Outputs of the I/V converting circuits 51, 52 are supplied to a difference amplifying circuit 53, and a signal OUT corresponding to the difference is outputted. The stress sensing FETs are arranged in different directions. Specifically, the FET 401 is so arranged that the length of the gate is perpendicular to the direction of a stress, and the FET 402 is so arranged that the gate length is parallel with the direction of a stress.

Figure 32A:
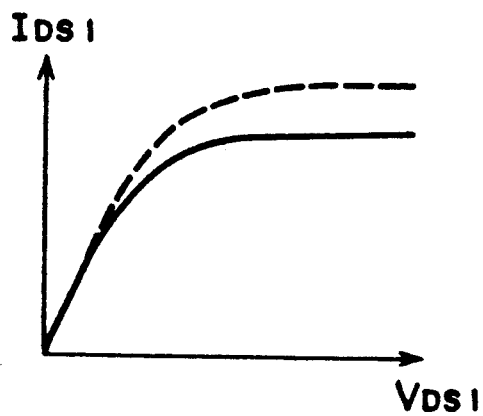
FIGS. 32(a) and (b) are views of changes of a characteristic of the FETs due to a stress.
Figure 32B:
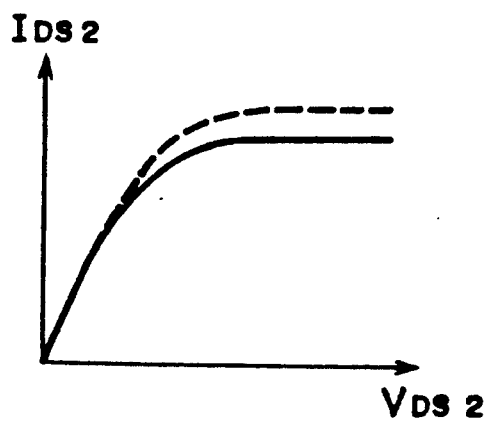

FIGS. 32(a) and (b) show the current-voltage characteristics of the FETs 401, 402, and the characteristic changes due to a stress. Drain-source voltages of the FETs 401, 402 are plotted on the horizontal axes $V_{DS1}$, $V_{DS2}$. Drain currents of the FETs 401, 401 are plotted on the vertical axes $I_{DS1}$, $I_{DS2}$. The FETs 401, 402 are fabricated in accordance with the same specifications. Accordingly their I-V characteristics are, in principle, substantially the same as indicated by the solid lines in FIGS. 32 (a) and (b). Here it is assumed that the cantilever is deformed, and a stress is applied to the FETs 401, 402. Then, in the FET 401, whose gate length is perpendicular to the direction of a stress, a change of the drain current due to the piezoelectric effect is large as indicated the dot line in FIG. 32(a). In contrast to this, in the FET 402, whose gate length is parallel with the direction of a stress, a change of the drain current is small as indicated by the dot line in FIG. 32(b).

In FIG. 31, currents $I_1$, $I_2$ flowing into the two amplifiers A becomes $I_1 > I_2$ (e.g., $I_1 = 2I_2$) and then converted into voltage signals $V_1$, $V_2$ to be supplied to a difference amplifying circuit 53. The difference amplifying circuit 53 gives a difference between the voltages $V_1$, $V_2$ to amplify the deference. Accordingly an output OUT of the difference amplifying circuit 53 becomes a signal corresponding to the level of a stress applied to the FETs 401, 402.

As described above, in this embodiment, changes of the I-V characteristic of the FETs are generated on principles completely different from resistance changes owing to the piezoelectric effect, and the changes are very sensible. This makes it possible to realize sensors with very high sensitivity. In this embodiment, since the FETs 401, 402 are formed in the proximal end of the cantilever 3, a temperature change takes place substantially similarly in the FETs 401, 402. This makes the temperature characteristic very preferable. The temperature characteristic becomes better as the FETs 401, 402 are nearer.

Figure 33A:
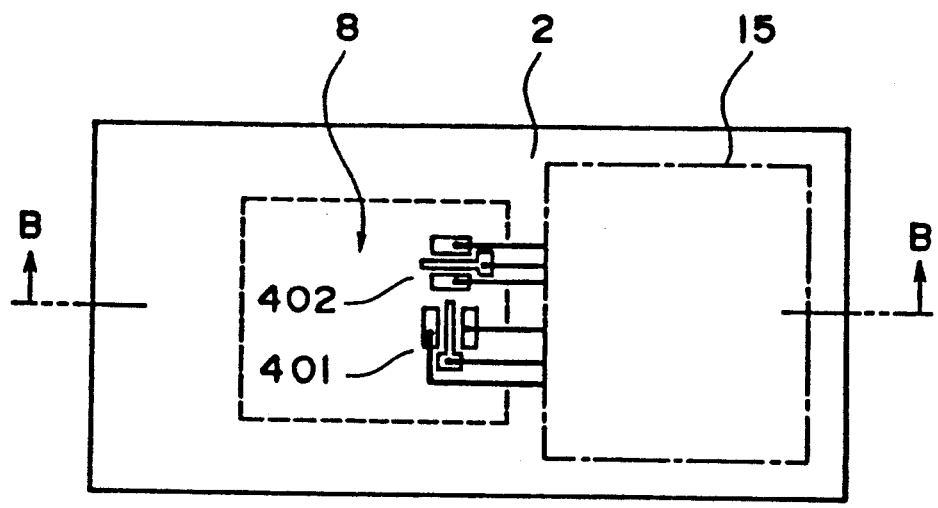
FIG. 33(a) is a plan view of a differential type semiconductor sensor according to one embodiment of this invention.
Figure 33B:
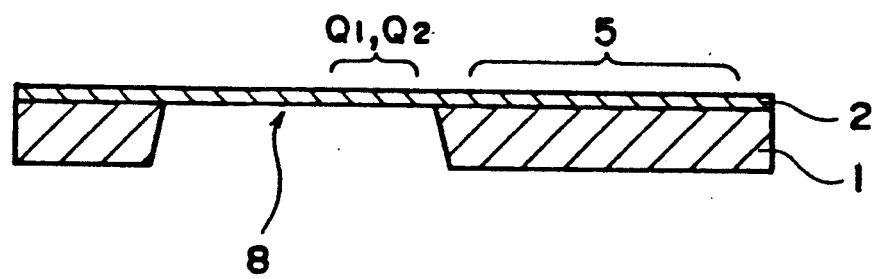
FIG. 33(b) is a sectional view of FIG. 33(a) along the line B—B therein.

The above-described embodiment may be adapted to the diaphragm of FIG. 33. As shown, a semiconductor substrate 1 is partially removed to form a diaphragm 8 of the crystal growth layer 2. On the end of the diaphragm MESFETs 401, 402 are formed. The length of the gate electrode of the FET 401 is perpendicular to the direction of a stress, and the length of the gate electrode of the FET 402 is parallel with the direction of a stress. Accordingly the I-V characteristic of the FET 401 more greatly changes with respect to levels of stresses.

Figure 34:
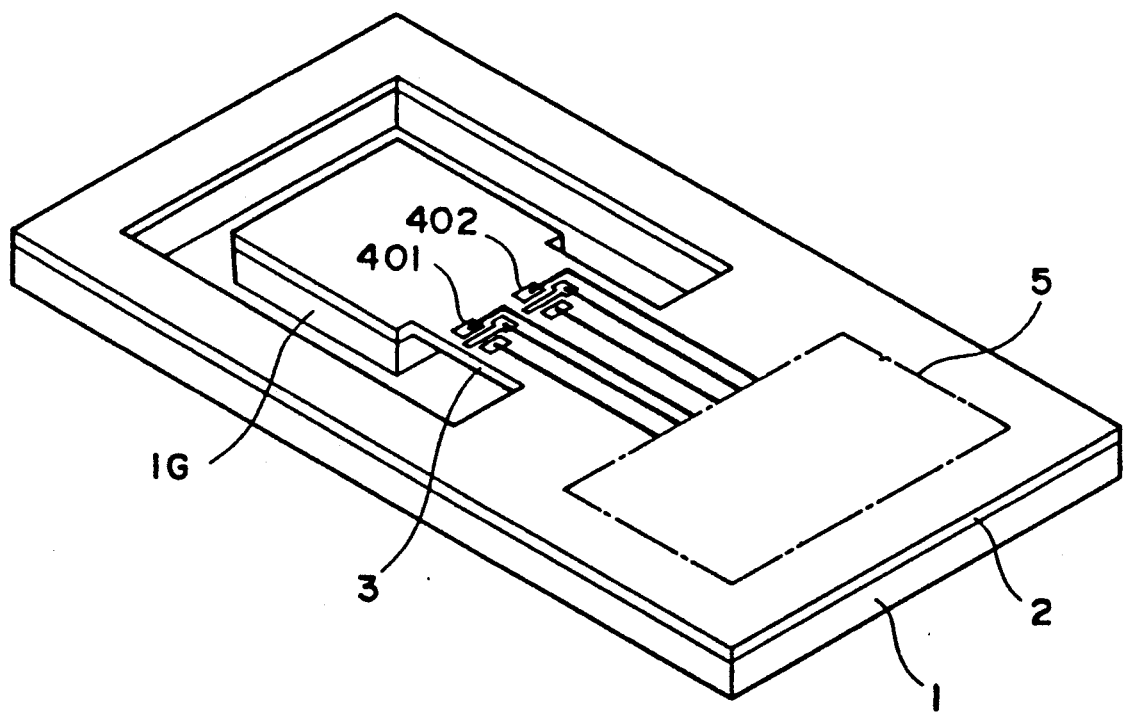
FIG. 34 is a perspective view of a differential type semiconductor sensor according to one embodiment of this invention.

In the semiconductor sensor according to the embodiment of FIG. 34, a pair of MESFETs 401, 402 are formed in the same direction on the proximal end of a cantilever 3 as semiconductor devices for sensing stresses. The FETs 401, 402 have the same size, but their gate electrodes are made of different materials. Specifically, the gate electrode of the FET 401 is formed of Ti (or Cr) in a thickness of 500 Å and W superposed on the Ti in a thickness of 4000 Å. The gate electrode of the FET 402 is formed of aluminium in place of the W in the same thickness. The FETs 401, 402 are fabricated in the same specifications except the physical strengths of their gate electrodes. Accordingly their I-V characteristics are in principle substantially the same as shown by the solid curves in FIGS. 32(a) and (b). Here it is assumed that the cantilever is deformed, and a stress is applied to the FETs 401, 402. In the FET 401, whose gate electrode is made of W having a high Young's modulus, a change of the I-V characteristic due to the piezoelectric effect is large as shown by the dot curve in FIG. 32(a). In contrast to this, in the FET 402, whose gate electrode is made of aluminium having a low Young's modulus, a change of the I-V characteristic is small as indicated by the dot curve in FIG. 32 (b). These I-V characteristics are detected by the same circuit as in FIG. 31.

This embodiment may be combined with the embodiment of FIG. 30. That is, in the semiconductor sensor of FIG. 30, the gate electrode of the FET 401 whose length is perpendicular to the direction of a stress is made of a material having a high Young's modulus, and the gate electrode of the FET 402, whose length is parallel with the direction of a stress is made of a material having a low Young's modulus. This combination, and the circuit of FIG. 31 constitute a circuit which attains the effects better compared with the above-described embodiment. Changing the thicknesses of the gate electrodes without changing the materials thereof can cause a stress to generate a difference between changes of the characteristics. Consequently the same effects can be obtained.

Figure 35:
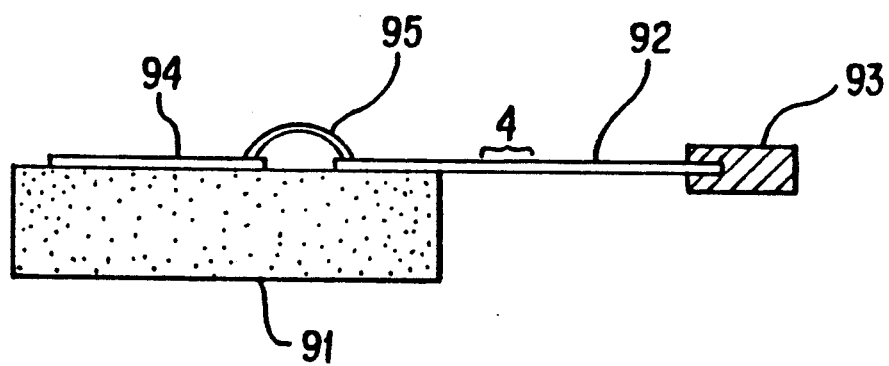
FIG. 35 is a sectional view of the semiconductor sensor according to one embodiment of this invention, using GaAs LEC substrate.

The semiconductor sensor according to one embodiment of this invention is shown in FIG. 35. In this embodiment, a support is formed by basic plate 91 of alumina, to the end of the top surface of the basic plate 91 there is attached a thin chip 92 of a piezoelectric semiconductor, such as, GaAs by means of an adhesive (not shown). The chip 92 of GaAs is formed in a cantilever supported by the basic plate 91. A weight 93 is secured to the forward end of the chip 92. On the GaAs chip 92 an elastically deformable member is defined between the portion thereof secured to the basic plate 91 and the weight 93. On the top surface of the elastically deformable member a stress detecting device 4, e.g., a MESFET, is formed. A hybrid integrated circuit substrate (H-IC substrate) 94 is secured to the top surface of the alumina basic plate 91. A terminal of the H-IC substrate 94 and an electrode pad formed on the GaAs chip 92 is connected by a wire 95 of gold (Au). A signal processing circuit for supplying a driving signal to the stress sensing device 4 and receiving a detected signal from the stress sensing device 4 to process a required signal processing may be formed on the GaAs chip 92 or the H-IC substrate 94.

The semiconductor sensor of FIG. 35 is fabricated by the following process. A GaAs wafer made semiinsulative by doping, e.g., Cr, is prepared, and the surface of the wafer is finished in a mirror surface. Next, a photo mask is formed for forming a FET, for example, by photolithography. Then ions, an n-type impurity, are implanted to form an ion-implanted region in the GaAs wafer. Then the GaAs wafer is coated with a SiO₂ film and heat-treated at 850° C. for 15 minutes to activate the ion-implanted region. Subsequently, the gate electrode, the source electrode and the drain electrode of the MESFET are formed by lift-off. Following this electrode formation, the wafer is heat-treated at about 400° C. (alloying), and protons are selectively implanted for the isolation of the device. Then layer insulative film is formed, and the insulative film is selectively etched to form a contact hole. After a wiring layer is formed on the insulative film, a passivation film is formed. Thus prepared GaAs wafer with a FET or others formed therein is divided into GaAs chips by dicing. The prepared GaAs chips are secured to the alumina basic plate.

In the semiconductor sensor of FIG. 35, the elastically deformable member is not formed of the so-called crystal growth layer of GaAs but a LEC (Liquid Encapsulated Czochralski) substrate or a HB (Horizontal Bridgeman) substrate. A MESFET or others as the stress sensing device is formed in the LEC substrate or others by the ion implantation. Accordingly it is easy to realize good detecting characteristics.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A semiconductor sensor comprising:
   a support;
   an elastically deformable member which is deformable by an external physical force applied thereto and which is secured to the support;
   a field-effect transistor which is formed in a piezoelectric semiconductor material supported on said elastically deformable member and in which a change comprising one of a physical alteration and a chemical alteration takes place in response to said force;
   means for supplying a gate of said field-effect transistor with a predetermined d.c. bias;
   a constant-current supply means for supplying a predetermined drain current to a drain of the field-effect transistor; and
   signal detecting means for detecting said change caused by said external physical force, based on a change of the drain potential of the field-effect transistor, to output a sensor signal corresponding to said change.

2. A semiconductor sensor according to claim 1, wherein the constant-current supply means includes as a device for determining a value of the drain current a field-effect transistor having its source and gate short-circuited.

3. A semiconductor sensor according to claim 1, wherein the constant-current supply means includes a current mirror circuit.

4. A semiconductor sensor according to claim 3, wherein the current mirror circuit includes as a device for determining a value of the drain current a field-effect transistor having a set d.c. bias supplied to its gate.

5. A semiconductor sensor according to claim 1, wherein the constant-current supply means includes a field-effect transistor having a bias voltage applied to its gate which is set in accordance with a temperature.

6. A semiconductor sensor according to claim 1, wherein the elastically deformable member comprises a crystal growth layer of a piezoelectric semiconductor material secured to the support, and a signal processing circuit including at least one of the constant-current supply means and the signal detecting means is formed on the crystal growth layer.

7. A semiconductor sensor comprising:
   a support;
   an elastically deformable member which is deformable by an external physical force applied thereto and which is secured to the support;
   a field-effect transistor which is formed in a semiconductor material supported on said elastically deformed member and in which a deformation occurs when the elastically deformable member is deformed;
   bias supply means for supplying a d.c. bias to a gate of the field-effect transistor and a constant-voltage between a source and a drain of the field-effect transistor; and
   signal detecting means for detecting a change caused by said external physical force or a chemical change, based on a change of the drain current of the field-effect transistor, to output a sensor signal corresponding to the change.

8. A semiconductor sensor according to claim 7, wherein the signal detecting means converts the drain current into a voltage to output the sensor signal as a voltage signal.

9. A semiconductor sensor according to claim 7, wherein the signal detecting means includes an oscillation circuit the oscillation frequency of which varies in accordance with a change of the drain current to output the sensor signal as a frequency signal.

10. A semiconductor sensor according to claim 7, wherein the elastically deformable member comprises a crystal growth layer of a piezoelectric semiconductor material secured to the support, and a signal processing circuit including at least one of bias supply means and the signal detecting means is formed on the crystal growth layer.

11. A semiconductor sensor comprising:
   a support;
   an elastically deformable member which is deformable by an external physical force applied thereto and which is secured to the support;
   a field-effect transistor which is formed in a piezoelectric semiconductor material supported on said elastically deformable member and in which a deformation occurs when the elastically deformable member is deformed;
   signal supply means for supplying an a.c. voltage signal to a gate of the field-effect transistor; and
   signal detecting means for detecting a change caused by said external physical force, based on a change of an a.c. current component of an output signal of the field-effect transistor, to output a sensor signal corresponding to said change.

12. A semiconductor sensor according to claim 11, wherein the signal detecting means includes I/V converting means for converting a drain current of the field-effect transistor to a voltage signal; a high-pass filter for blocking d.c. and low-frequency components of an output of the I/V converting means; and AM detector means for amplitude modulation detecting an output of the high-pass filter.

13. A semiconductor sensor according to claim 11, wherein the elastically deformable member comprises a crystal growth layer of a piezoelectric semiconductor material and secured to the support, and a signal processing circuit including at least one of the signal supply means and the signal detecting means is formed on the crystal growth layer.

14. A semiconductor sensor comprising:
   a support;
   an elastically deformable member which is deformable by an external physical force applied thereto and which is secured to the support;
   a field-effect transistor which is formed in a piezoelectric semiconductor material supported on said elastically deformable member and in which a deformation occurs when the elastically deformable member is deformed;
   signal supply means for supplying an a.c. voltage signal biased with a set direct current to a gate of the field-effect transistor;
   first signal detecting means for detecting a change caused by said external physical force, based on a change of an a.c. component of an output signal of the field-effect transistor, to output a first sensor signal corresponding to said change; and
   second signal detecting means for outputting a second sensor signal corresponding to a change of a temperature of the elastically deformable member, based on a change of a d.c. component of the output of the field-effect transistor.

15. A semiconductor sensor according to claim 14, wherein the first signal detecting means includes I/V converting means for converting a drain current of the field-effect transistor to a voltage signal, and a high-pass filter for blocking a d.c. and a low frequency component of an output of the I/V converting means, and AM detecting means for amplitude modulation detecting an output of the high-pass filter; the second signal detecting means includes integrating means for integrating an output of the I/V converting means with a set time constant.

16. A semiconductor sensor according to claim 14, wherein the elastically deformable member comprises a crystal growth layer of a piezoelectric semiconductor material secured to the support; and a signal processing circuit including at least one of the signal supply means, the first signal detecting means and the second signal detecting means is formed on the crystal growth layer.

17. A semiconductor sensor comprising:
   a support;
   an elastically deformable member which is deformable by an external physical force applied thereto and which is secured to the support;
   a plurality of field-effect transistors which are formed in a piezoelectric semiconductor material supported on said elastically deformable member and which are oriented in different directions relative to one another with respect to a direction of generation of a stress due to deformation of said elastically deformable member; and
   a signal detecting means for detecting changes caused by said external physical force, based on a difference of changes in an electrical characteristic among the field-effect transistors, to output a sensor signal corresponding to said changes.

18. A semiconductor sensor according to claim 17, wherein said field-effect transistors include a first and a second field-effect transistor; and the signal detecting means includes first and second I/V converting means for converting drain currents of the first and the second field-effect transistors to voltage signals, and operational means for computing a difference of outputs of the first and a second I/V converting means.

19. A semiconductor sensor according to claim 17, wherein the elastically deformable member comprises a crystal growth layer of a piezoelectric semiconductor secured to the support; and the signal detecting means is formed on the crystal growth layer.

20. A semiconductor sensor comprising:
   a support;
   an elastically deformable member which is deformable by an external physical force and which is secured to the support;
   a plurality of field-effect transistors which are supported on said elastically deformable member and whose gates have physical strengths different from one another; and
   signal detecting means for detecting changes caused by said external physical force, based on a difference of changes in an electrical characteristic among the field-effect transistors, to output a sensor signal corresponding to said changes.

21. A semiconductor sensor according to claim 20, wherein said gates of said field-effect transistors are made of materials different from one another.

22. A semiconductor sensor according to claim 20, wherein said gates of said field-effect transistors have thicknesses different from one another.

23. A semiconductor sensor according to claim 20, wherein said field-effect transistors include a first and a second field-effect transistors; and the signal detecting means includes first and second I/V converting means for converting drain currents of the first and the second field-effect transistors to voltage signals, and operational means for computing a difference of outputs of the first and a second I/V converting means.

24. A semiconductor sensor according to claim 20, wherein the elastically deformable member comprises a crystal growth layer of a piezoelectric semiconductor material secured to the support; and the signal detecting means is formed on the crystal growth layer.

* * * * *